United States Patent [19]

Engebretson et al.

[11] Patent Number: 5,016,280
[45] Date of Patent: May 14, 1991

[54] ELECTRONIC FILTERS, HEARING AIDS AND METHODS

[75] Inventors: A. Maynard Engebretson, Ladue; Michael P. O'Connell, Maplewood; Baohua Zheng, University City, all of Mo.

[73] Assignee: Central Institute for the Deaf, St. Louis, Mo.

[21] Appl. No.: 172,266

[22] Filed: Mar. 23, 1988

[51] Int. Cl.$^5$ .................. H04R 25/00; H03B 29/00
[52] U.S. Cl. .................................. 381/68; 381/68.2; 381/68.4; 381/83; 381/93
[58] Field of Search .............. 381/68, 68.4, 93, 83, 381/68.2

[56] References Cited

U.S. PATENT DOCUMENTS

| | | | |
|---|---|---|---|
| 3,818,149 | 6/1974 | Stearns et al. | 381/68.2 |
| 4,025,721 | 5/1977 | Graupe et al. | 381/68.2 |
| 4,038,536 | 7/1977 | Feintuch | 328/167 |
| 4,053,846 | 10/1977 | Acker | 330/279 |
| 4,099,035 | 7/1978 | Yanick | 381/68.2 |
| 4,118,604 | 10/1978 | Yanick | 381/68.4 |
| 4,185,168 | 1/1980 | Graupe et al. | 381/68 |
| 4,186,384 | 1/1980 | Acker | 375/11 |
| 4,187,413 | 2/1980 | Moser | 381/68 |
| 4,188,667 | 2/1980 | Graupe et al. | 381/68.4 |
| 4,232,192 | 11/1980 | Beex | 381/83 |
| 4,243,959 | 1/1981 | Duttweiler | 333/166 |
| 4,417,317 | 11/1983 | White et al. | 375/11 |
| 4,425,481 | 1/1984 | Mansgold et al. | 381/68.2 |
| 4,449,237 | 5/1984 | Stepp et al. | 381/83 |
| 4,471,171 | 9/1984 | Kopke et al. | 381/68.2 |
| 4,490,841 | 12/1984 | Chaplin et al. | 381/71 |
| 4,493,101 | 1/1985 | Muraoka et al. | 381/93 |
| 4,525,856 | 6/1985 | Admiraal et al. | 381/93 |
| 4,539,690 | 9/1985 | Speidel | 375/11 |
| 4,543,453 | 9/1985 | Brander | 381/68 |
| 4,548,082 | 10/1985 | Engebretson et al. | 381/68.2 |
| 4,621,172 | 11/1986 | Kanemasa et al. | 370/32.1 |
| 4,629,829 | 12/1986 | Puhl et al. | 379/411 |
| 4,637,402 | 1/1987 | Adelman | 381/68.2 |
| 4,658,426 | 4/1987 | Chabries et al. | 381/94 |
| 4,707,824 | 11/1987 | Kanemasa | 379/410 |
| 4,731,850 | 3/1988 | Levitt et al. | 381/68.2 |
| 4,752,903 | 6/1988 | Iwata et al. | 364/724.19 |
| 4,769,808 | 9/1988 | Kanemasa et al. | 379/410 |
| 4,783,818 | 11/1988 | Graupe et al. | 381/71 |

FOREIGN PATENT DOCUMENTS

624524 7/1981 Switzerland .................. 381/68

OTHER PUBLICATIONS

*Hearing Instruments*, "Active Filtering—A Step Toward the Programmable Hearing Aid", vol. 33, No. 10, Oct. 1982, pp. 20+.
Oppenheim et al., *Digital Signal Processing* (1975), pp. 136–173, 268–269, 438–444, with face sheets.
MacWilliams et al., "Pseudo-Random Sequences and Arrays", Dec. (1976), pp. 1715–1729, *Proceedings of the IEEE*, vol. 64.

(List continued on next page.)

*Primary Examiner*—Jin F. Ng
*Assistant Examiner*—M. Nelson McGeary, III
*Attorney, Agent, or Firm*—Senniger, Powers, Leavitt & Roedel

[57] ABSTRACT

An electronic filter for an electroacoustic system. The system has a microphone for generating an electrical output from external sounds and an electrically driven transducer for emitting sound. Some of the sound emitted by the transducer returns to the microphone means to add a feedback contribution to its electical output. The electronic filter includes a first circuit for electronic processing of the electrical output of the microphone to produce a filtered signal. An adaptive filter, interconnected with the first circuit, performs electronic processing of the filtered signal to produce an adaptive output to the first circuit to substantially offset the feedback contribution in the electrical output of the microphone, and the adaptive filter includes means for adapting only in response to polarities of signals supplied to and from the first circuit. Other electronic filters for hearing aids, public address systems and other electroacoustic systems, as well as such systems, and methods of operating them are also disclosed.

78 Claims, 15 Drawing Sheets

OTHER PUBLICATIONS

Widrow et al., "Adaptive Noise Cancelling: Princples and Applications", (1976?), 25 pps., unnumbered.

Shichor et al., "Adaptive Linear Prediction Using a Sign Decorrelator", (1977), *IEEE Trans. Acous., Speech, & Signal Proces.*, 6/77, pp. 262-264.

Rabiner et al., *Digital Processing of Speech Signals* (1978), cover, face sheets, pp. 18-31.

Schroeder, "Integrated-Impulse Method Measuring Sound Decay Without Using Impulses", J. Acoust. Soc. Am., (1979), pp. 497-500.

Meade, *Introduction to VLSI Systems*, Adison-Wesley Series in Computer Science, (1980), face sheets, pp. 60-80, plates 1-8, pp. 81-85, 91-114, plates 9-15, pp. 155-164.

Duttweiler, "Adaptive Filter Performance with Nonlinearities in the Correlation Multiplier", *IEEE Trans. Acoust., Speech, & Signal Proces.*, vol. ASSP-30, #4, 8/82.

Larson, "Studies in Acoustic Feedback in Hearing Aids", *Rehabilitation R&D Progress Reports*, 1985, pp. 304-305.

Weaver et al., "Electronic Cancellation of Acoustic Feedback to Increase Hearing-Aid Stability", *J. Acoust. Soc. Am. Suppl.* 1, vol. 77, Spring 1985, p. S105.

Egolf et al., "Studies in Acoustic Feedback in Hearing Aids", *Rehabiliation R&D Progress Reports*, 1986, p. 315.

Xue et al., "Adaptive Equalizer Using Finite-Bit Power-of-Two Quantizer", Trans. Acoust. Speech & Signal Proces., vol. ASSP-34, #6, Dec. 1986, pp. 1603-1611.

Egolf, "Review of the Acoustic Feedback Literature from a Control Systems Point of View", (undated), pp. 94-103.

Engebretson et al., "A Wearable, Pocket-Sized Processor for Digital Hearing Aid and Other Hearing Prostheses Applications", 1986, pp. 1-4.

Morley et al., "A Multiprocessor Digital Signal Processing System for Real-Time Audio Applications", *IEEE Trans. Acous., Speech & Signal Proces.*, vol. ASSP-34, #2, Apr. 1986.

"Hearing Aids Are Going Digital", *Electronics*, 1-22-87, p. 108.

Morley, "Breaking the Frequency Barrier", *IEEE Potentials Magazine*, 2/87, cover, index, pp. 32-35.

Engebretson, "RESNA '87", Proceedings of the 10th Annual Conf. on Rehab. Tech., Jun. 1987.

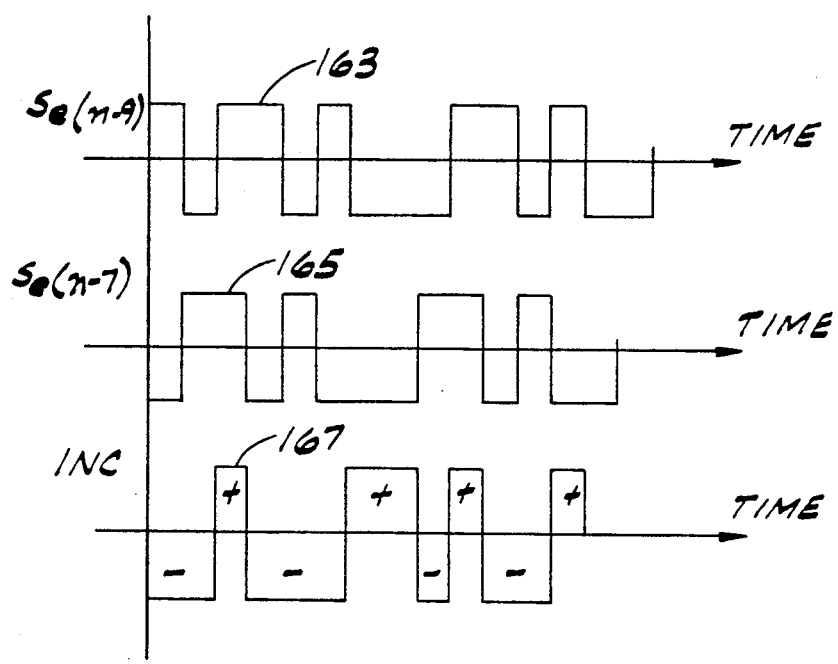
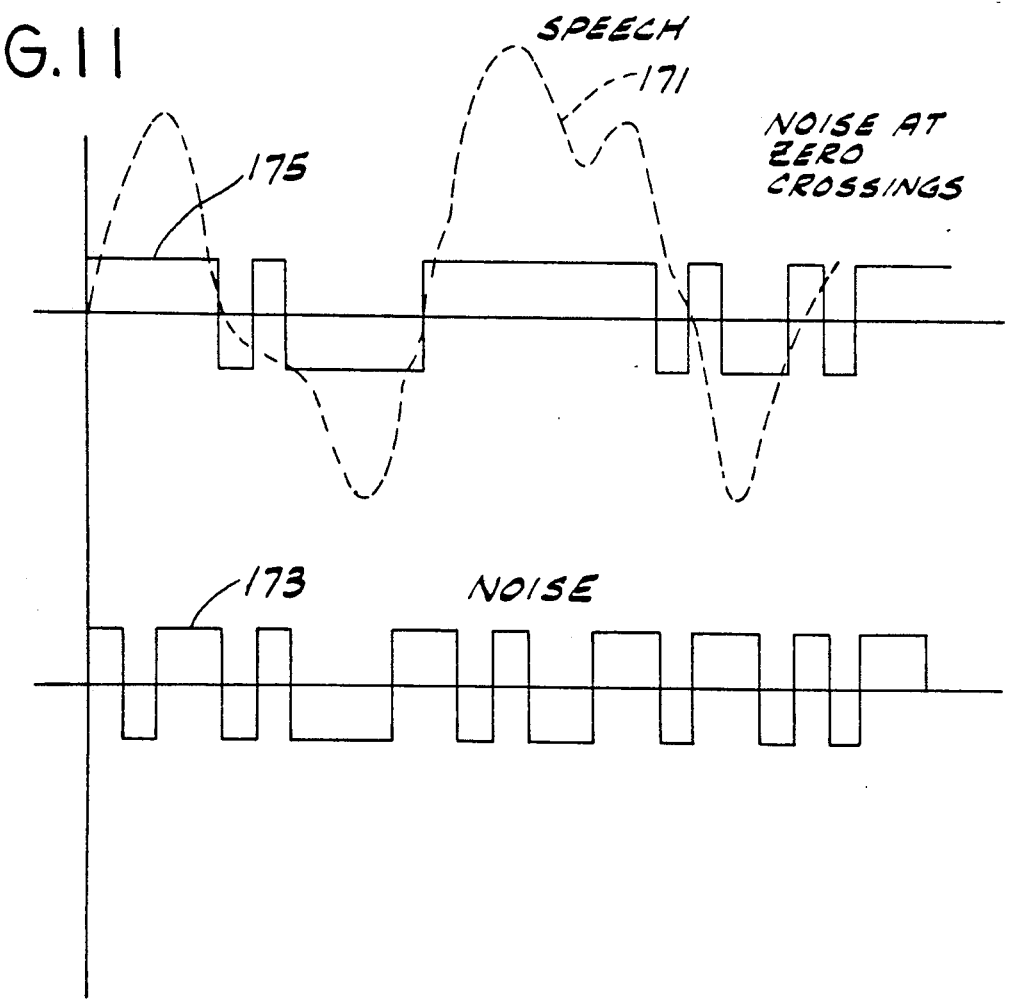

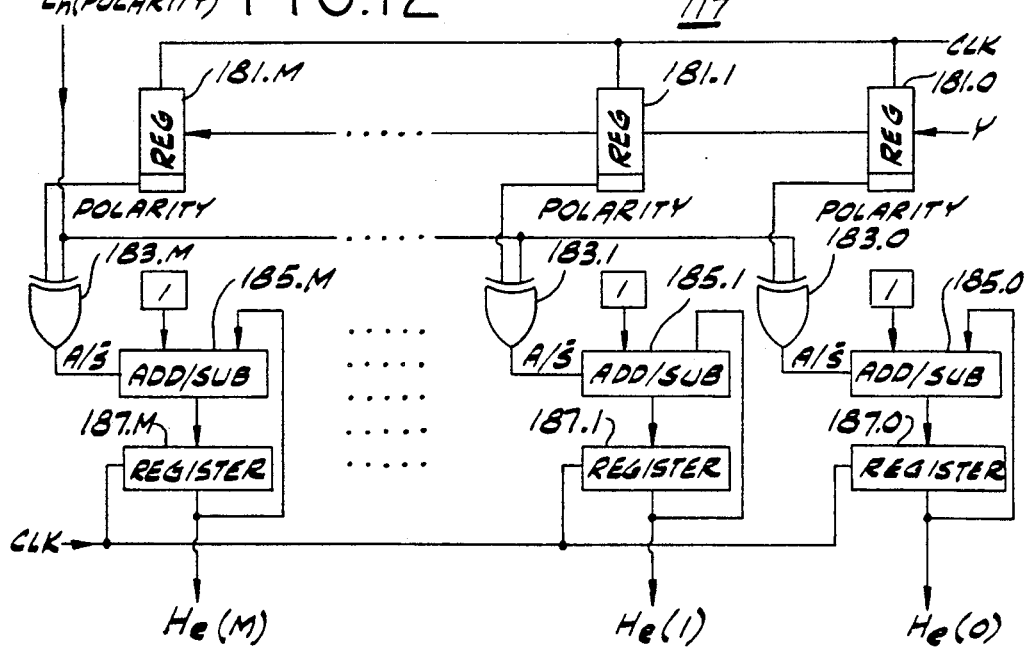
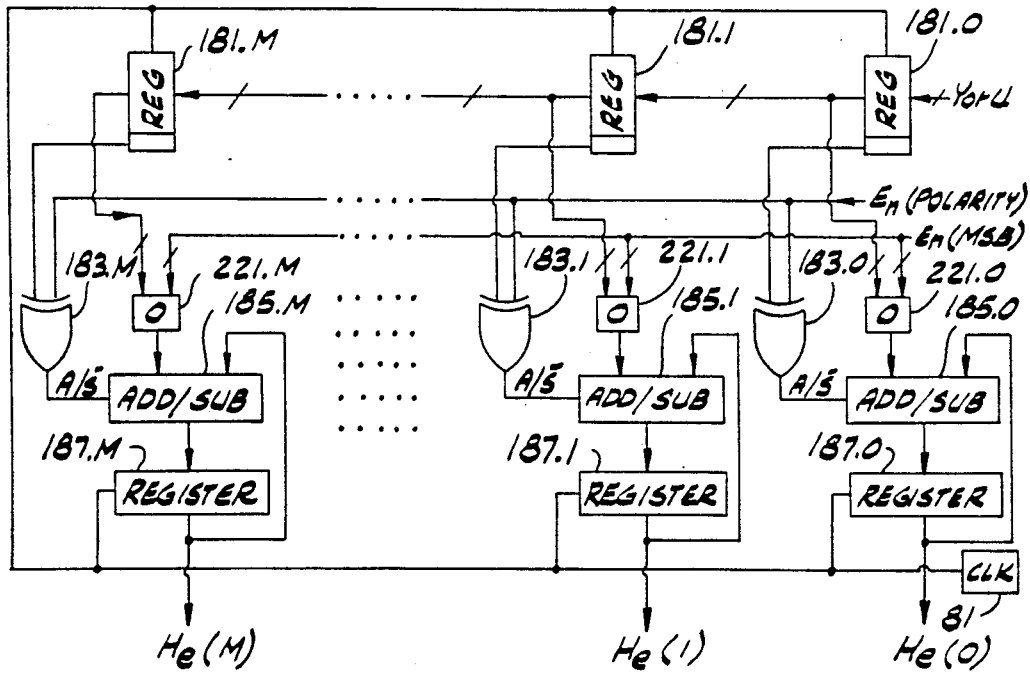

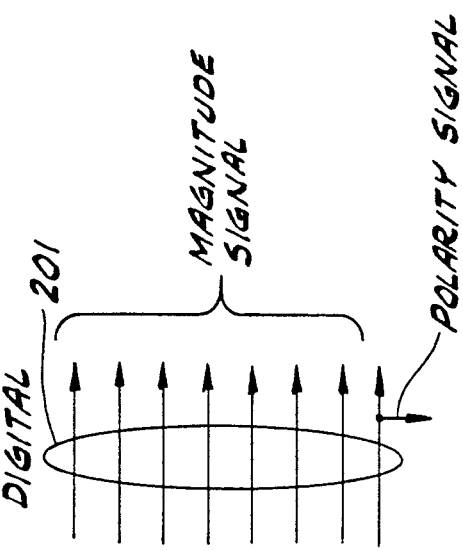
FIG.14
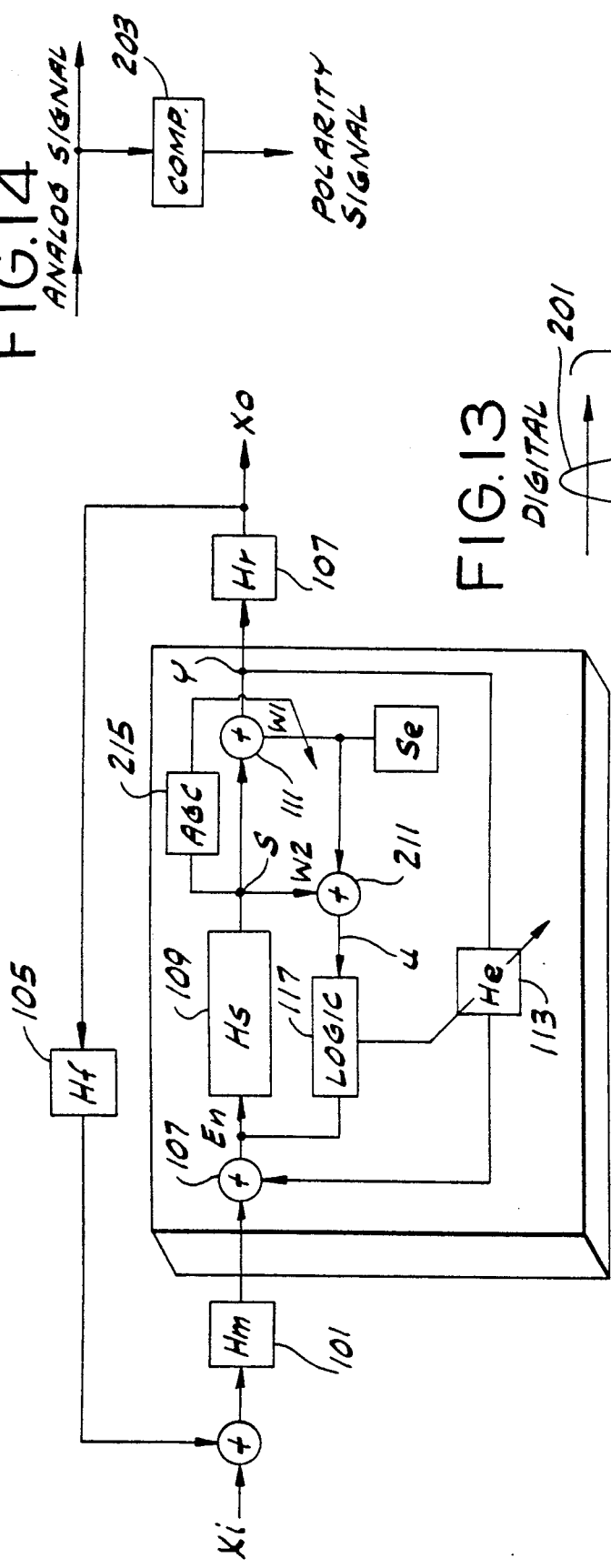
FIG.13
FIG.15

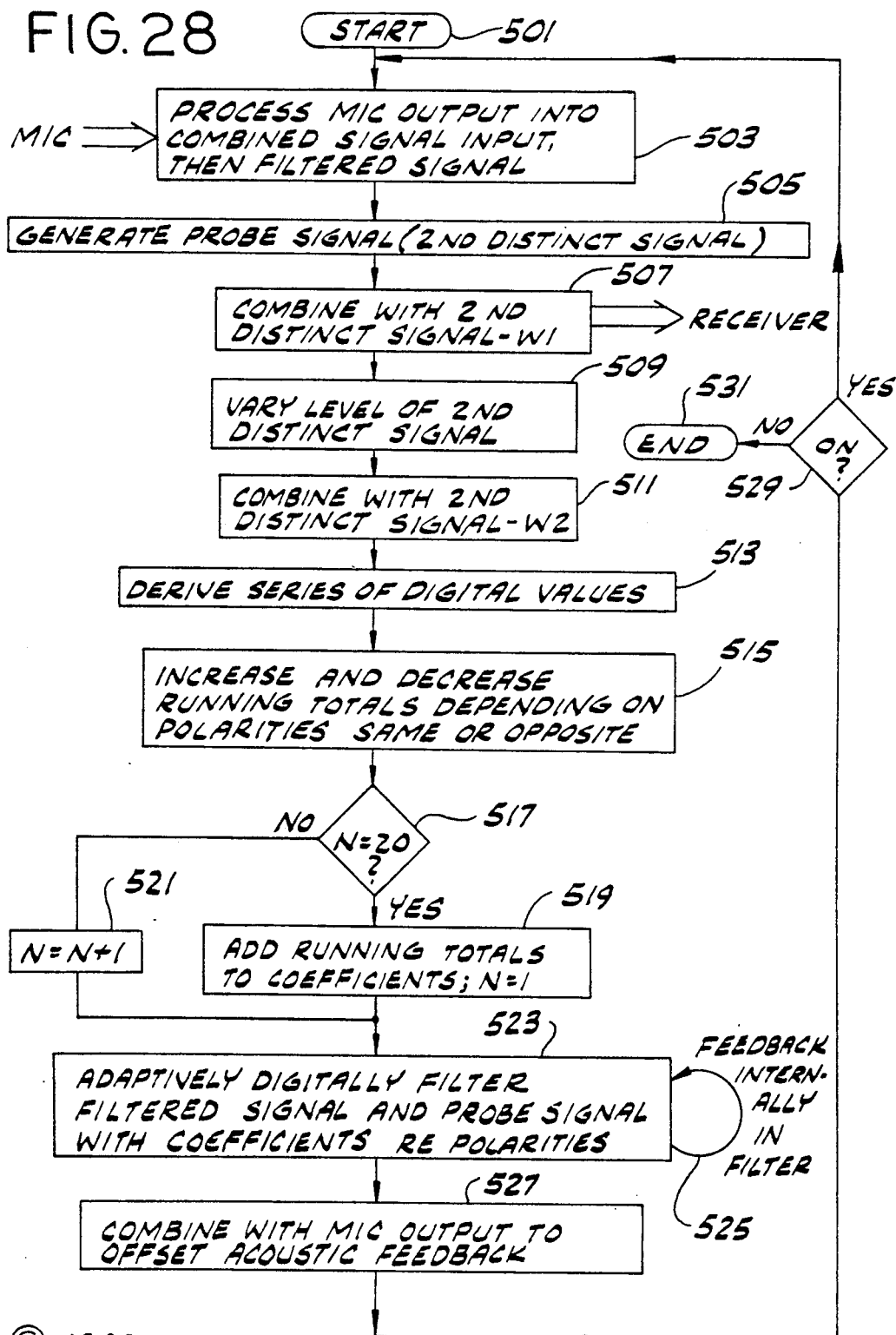

ELECTRONIC FILTERS, HEARING AIDS AND METHODS

GOVERNMENT SUPPORT

This invention was made with U.S. Government support under Veterans Administration Contract V674-P-857 and V674-P-1736 and National Aeronautics and Space Administration (NASA) Research Grant No. NAG10-0040. The U.S. Government has certain rights in this invention.

FIELD OF THE INVENTION

The present invention relates to electronic filters for hearing aids, public address systems, and other electroacoustic systems, hearing aids with electronic filters and methods of operation. More particularly, the present invention relates to electronic adaptive filters and filtering methods to offset disadvantageous acoustic feedback in hearing aids, public address systems and other electroacoustic systems.

BACKGROUND OF THE INVENTION

Electronic hearing aids and methods are discussed in coassigned U.S. Pat. No. 4,548,082 which is incorporated herein by reference as an example of an electroacoustic system in which the present invention can be used.

Without limiting the scope of the present invention in hearing aids, public address systems and electroacoustic systems in general, the background of the invention is described specifically in connection with its application to hearing aids.

A person's ability to hear speech and other sounds well enough to understand them is clearly important in employment and many other daily life activities. Improvements in hearing aids which are intended to compensate or ameliorate hearing deficiencies of hearing impaired persons are consequently important not only to these persons but also to the community at large.

Unfortunately, presently available hearing aids are often subject to a feedback phenomenon which produces distortion, ringing, and squealing. If the hearing aid can be adjusted by the hearing impaired person to reduce the feedback, the volume delivered is usually reduced also. Not only is the person enmeshed in a dilemma of choosing between feedback and reduced volume, but also the adjustment process itself is one more inconvenience in that person's life. Not surprisingly, many users of hearing aids leave the aid misadjusted or simply put the hearing aid aside because of the inconvenience and lack of satisfactory operation with which they must cope.

Conventionally, a microphone in the hearing aid generates an electrical output from external sounds. An amplifying circuit in the aid provides a filtered version of the electrical output corresponding to the sounds picked up by the microphone. The filtering can be due to an inherent characteristic of the amplifying circuit or may be deliberately introduced The amplified and filtered output of the hearing aid is fed to an electrically driven "receiver" for emitting sound into the ear of the user of the hearing aid. (In the hearing aid field, a receiver is the name of an electronic element analogous to a loudspeaker or other electroacoustic transducer.) Some of the sound emitted by the receiver returns to the microphone to add a feedback contribution to the electrical output of the microphone. The feedback is amplified by the hearing aid, and ringing or squealing often arise in an endlessly circular feedback process.

SUMMARY OF THE INVENTION

Among the objects of the present invention are to provide improved electronic filters, hearing aids, other electroacoustic systems and methods which substantially prevent undesirable feedback ringing and squealing; to provide improved electronic filters, hearing aids and other electroacoustic systems which are reliable, compact and economical; to provide improved electronic filters, hearing aids and methods which reliably reject undesirable feedback which otherwise could occur in the daily life of a hearing aid user as when the user puts a hand near the ear or the ear is near a chair back or wall; and to provide improved electronic filters, hearing aids and methods which reliably reject undesirable feedback when the user's jaw moves in talking or chewing.

Generally, one form of the invention is an electronic filter for an electroacoustic system. The system has a microphone for generating an electrical output from external sounds and an electrically driven transducer for emitting sound. Some of the sound emitted by the transducer returns to the microphone means to add a feedback contribution to its electrical output. The electronic filter includes a first circuit for electronic processing of the electrical output of the microphone to produce a filtered signal. An adaptive filter, interconnected with the first circuit, performs electronic processing of the filtered signal to produce an adaptive output to the first circuit to substantially offset the feedback contribution in the electrical output of the microphone, and the adaptive filter includes means for adapting only in response to polarities of signals supplied to and from the first circuit.

Generally and in another form of the invention, an electronic filter has a first circuit for electronically processing the electrical output of the microphone to produce a filtered signal and for combining the filtered signal with a second distinct signal for the transducer. Another circuit varies the second distinct signal in magnitude as a function of the magnitude of the filtered signal. An adaptive circuit, interconnected with the first circuit, processes the filtered signal and second distinct signal to produce an adaptive output to the first circuit to substantially offset the feedback contribution in the electrical output of the microphone means.

In general, and in a further form of the invention, an electronic filter includes a circuit for electronic processing of the electrical output of the microphone to produce a filtered signal. A first combining means combines the filtered signal with a second distinct signal for the transducer in a proportion wherein the magnitude of the second distinct signal is generally less than the magnitude of the filtered signal at loudness of normal speech. A second combining means combines the filtered signal with the second distinct signal to produce a control signal for affecting the processing by the circuit for electronic processing wherein the magnitude of the second distinct signal is generally greater than the magnitude of the filtered signal at loudness of normal speech.

Generally, still another form of the invention includes a circuit for generating a probe signal for the transducer so that a sound corresponding to the probe signal is included in the sound emitted by the transducer. A filter performs electronic processing of the probe signal in accordance with a series of coefficients to produce a filter output. Some of the sound corresponding to the probe signal returns to the microphone. Means for combining the filter output with the electrical output from the microphone means produces a combined signal input having a changing polarity. Another circuit electronically derives a series of values having polarities responsive to the probe signal. A further circuit increases and decreases running totals in a first storage circuit depending on whether a corresponding value in the series of values has the same or opposite polarity compared to the combined signal input. A yet further circuit respectively adds the running totals in the first storage circuit to the coefficients in a second storage circuit to update the coefficients for the filter less frequently than the increasing and decreasing of the running totals in the first storage circuit occurs.

In general, yet another form of the invention for use in a hearing aid is an electronic filter comprised of a VLSI die, a first circuit fabricated on the VLSI die for electronic processing of the electrical output of the microphone to produce a filtered signal and for combining the filtered signal with a second distinct signal for the receiver of the hearing aid. An all-hardware adaptive filter is united with and connected to the first circuit on the VLSI die for processing the filtered signal and second distinct signal to produce an adaptive output to said first circuit to substantially offset the feedback contribution in the electrical output of the microphone in the hearing aid.

In general, a yet further form of the invention for use in a hearing aid is an electronic filter having a circuit for amplifying the electrical output of the microphone to produce an amplified signal and for combining the amplified signal with a pseudorandom noise signal to produce a combined amplified signal for the receiver. An all-hardware filter performs electronic processing of the combined amplified signal in accordance with a series of coefficients to produce an adaptive output. Further provided is a means for combining the adaptive output with the electrical output from the microphone as a combined signal input to the circuit for amplifying, the combined signal input having a polarity that changes with time. Circuits temporarily store a series of values representing recent polarities of the pseudorandom noise signal and vary each coefficient in magnitude in the series of coefficients by increasing or decreasing each coefficient as a function of the combined signal input, the increasing or decreasing of each coefficient depending on whether a value corresponding thereto in the series of values is the same as or opposite from the currently-occurring polarity of the combined signal input. The adaptive output thereby substantially offsets the feedback contribution in the electrical output of the microphone.

Generally, a still further form of the invention is an electronic filter that includes a first circuit for electronic processing of the electrical output of the microphone means to produce a filtered signal and for combining the filtered signal with a second distinct signal for the transducer. Adaptive filter circuitry is interconnected with the first circuit and responds to signals supplied to and from the first circuit. The adaptive filter circuitry performs electronic infinite impulse response (IIR) processing of the filtered signal and second distinct signal to produce an adaptive output to the first circuit to substantially offset the feedback contribution in the electrical output of the microphone means. In this way resonances and very long feedback paths in hearing aids, public address systems and other electroacoustic systems are even further obviated.

Other forms of the invention are also disclosed, including hearing aid and other system combinations and methods for operating them and other electroacoustic systems.

Other objects and features will be in part apparent and in part pointed out hereinafter.

BRIEF DESCRIPTION OF THE DRAWINGS

FIG. 10 is another set of three graphs of voltage versus time, the first two graphs showing the combined input signal delayed relative to the probe signal, and the third graph showing a product signal sometimes positive and sometimes negative and thus having negligible effect on the value of another filter coefficient for simulating the feedback path;

FIG. 11 is a pair of graphs of voltage versus time showing that the polarity of a combined input signal including speech corresponds in polarity to a pseudorandom noise probe signal near zero crossings of the speech;

FIG. 12 is a partially block, partially schematic diagram of an inventive logic circuit for controlling an adaptive filter in FIG. 4;

FIG. 13 is a schematic diagram of a data bus carrying a digital signal having a magnitude and a polarity;

FIG. 14 is a schematic diagram of an analog signal line with a comparator for detecting a polarity signal;

FIG. 15 is another block diagram of an all hardware circuit on a VLSI die having first and second combining circuits for the noise signal according to another inventive embodiment;

FIG. 16 is a partially block, partially schematic diagram of another inventive form of logic circuit for controlling an adaptive filter for simulating a feedback path;

FIG. 28 is a process flow diagram illustrating some inventive methods for operating an electronic filter and a hearing aid of the invention.

Corresponding reference characters indicate corresponding parts throughout the several views of the drawings.

DETAILED DESCRIPTION OF PREFERRED EMBODIMENTS

Figure 1:
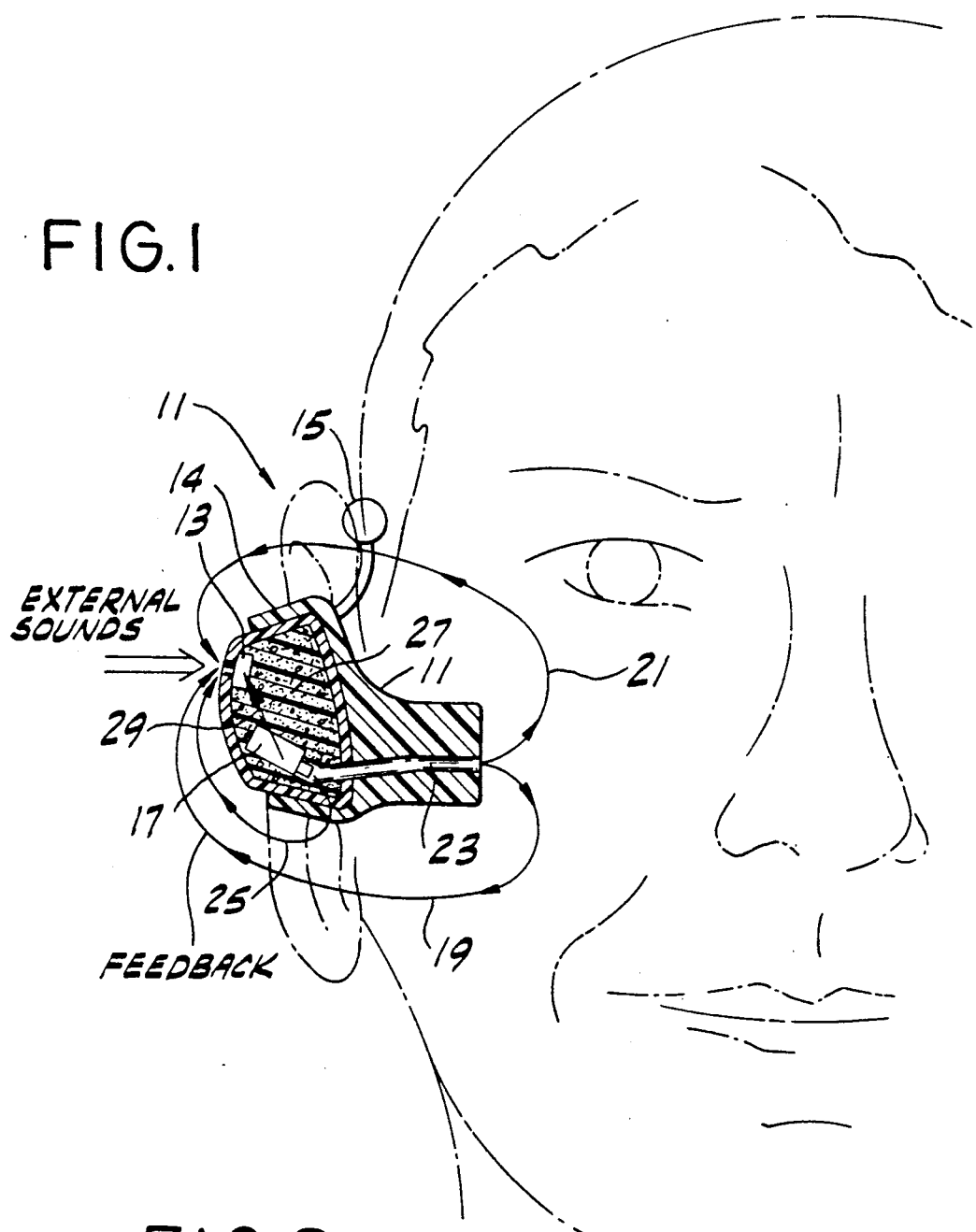
FIG. 1 is a pictorial of a user with a hearing aid of the invention including an electronic filter according to the invention, part of the hearing aid shown in cross-section.

In FIG. 1 a hearing aid 11 receives external sounds at an input microphone 13 in an earpiece 14. Microphone 13 generates an electrical output from sounds external to the user of the hearing aid for an over-the-ear-unit 15 which produces an electrical output for a receiver or transducer 17 that emits filtered and amplified sound from earpiece 14 into the ear of the user of the hearing aid. (In another hearing aid, not shown, the microphone 13 and receiver 17 are in a behind-the-ear (BTE) unit and not in an earpiece, and the improvements described herein are equally applicable to this and other units.)

For purposes of the present disclosure it is important to note that some of the sound emitted by receiver 17 returns to the microphone 13 as feedback indicated by arrows such as 19 and 21 from the opening of a channel 23 by which receiver 17 communicates with the ear canal of the user. Other feedback passes through the side of earpiece 14 and takes a shorter path to the input microphone as illustrated by arrow 25. Some sound 29 feeds back directly from receiver 17 through interior absorber material 27 of earpiece 14 to the microphone 13.

Feedback is disadvantageously associated with squealing, ringing, erratic operation and instability in the operation of hearing aid 11. Accordingly it is desirable to find some way to permit hearing aid 11 to operate more satisfactorily even though feedback according to the numerous paths indicated by arrows 19, 21, 25 and 29 unavoidably occurs.

Figure 2:
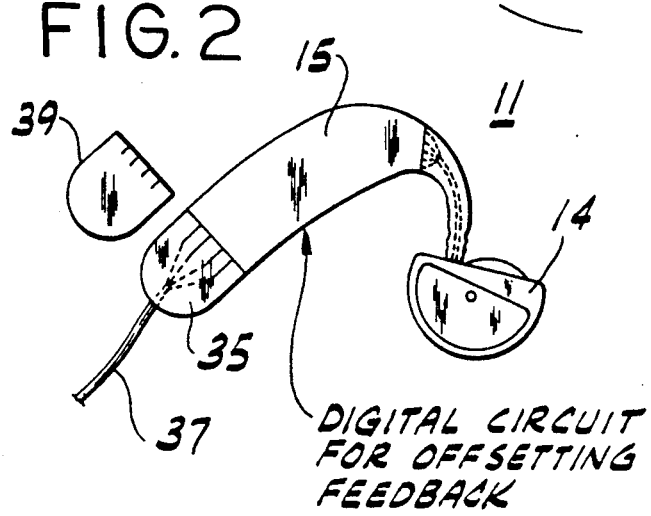
FIG. 2 is a pictorial side view of the hearing aid of FIG. 1.

FIG. 2 shows a side view of hearing aid 11 with its over-the-ear unit 15 which includes filtering and amplifying circuitry. In a clinical fitting procedure, unit 15 is loaded with digital information through a connector 35 connected by a cord 37 from a host computer system such as that described in U.S. Pat. No. 4,548,082 which is incorporated herein by reference. After the hearing aid 11 has been loaded at the clinic with information which suits it to ameliorate the particular hearing deficiency of the user, connector 35 is detached from the rest of the hearing aid and replaced with a battery pack 39 for convenient daily use. One type of preferred embodiment is improved with inventive feedback offsetting circuitry that requires no additional information from the host system to govern the offsetting operations.

Figure 3:
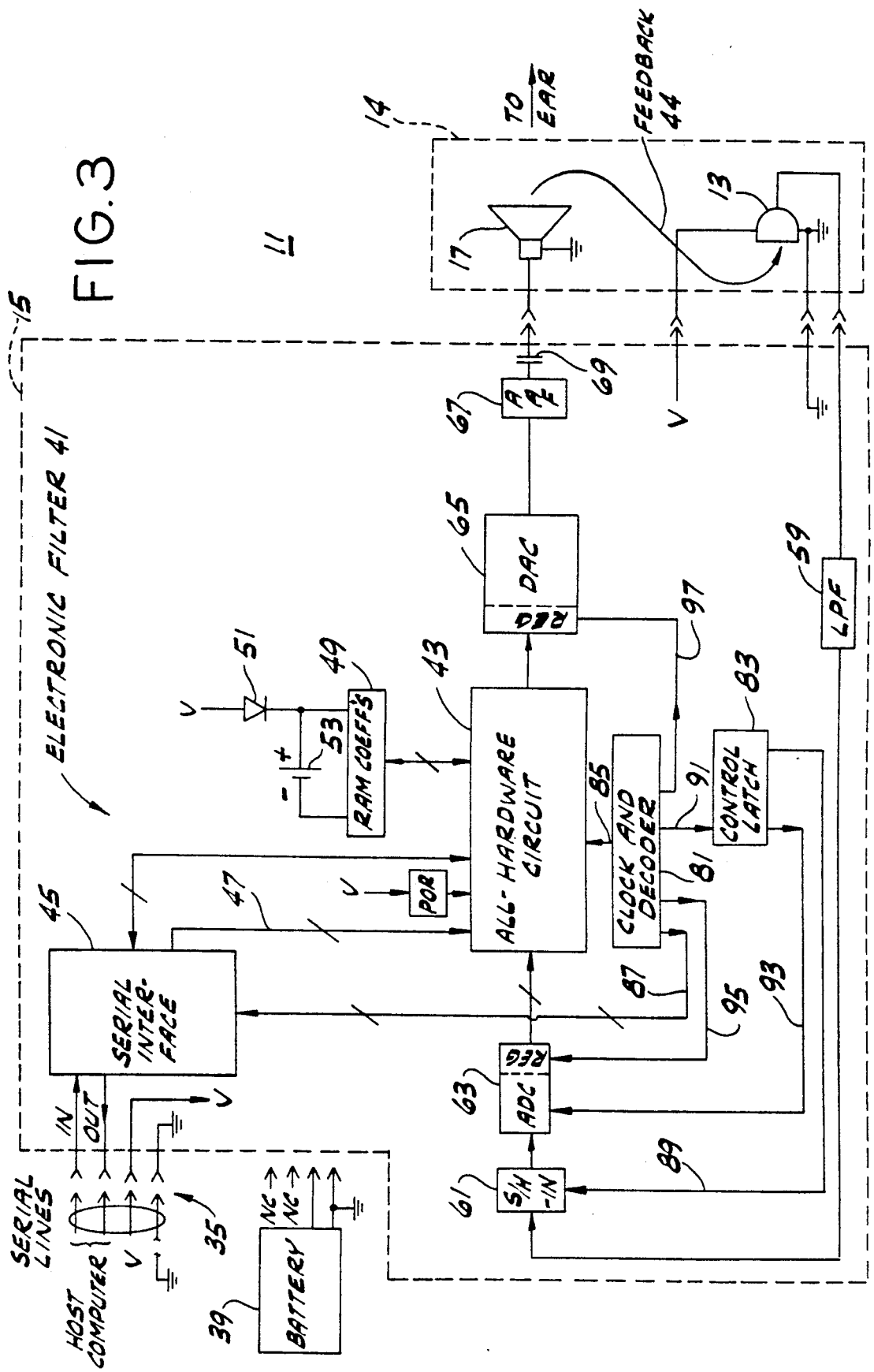
FIG. 3 is an electrical block diagram of the hearing aid of FIG. 1 including an inventive electronic filter circuit with an inventive all-hardware circuit, also showing an acoustic feedback path.

In FIG. 3 a block diagram of unit 15 includes an electronic filter 41 that has an all-hardware circuit 43 that accomplishes numerous functions for ameliorating the hearing deficiency of the user and offsets feedback contribution 44 which unavoidably occurs in hearing aid 11 as already discussed. Circuit 43 is discussed in greater detail hereinbelow.

Also as shown in FIG. 3, connector 35 of FIG. 2 includes terminals for a pair of serial lines from the host computer system, a line for external supply voltage V and a DC return common line. A battery in connector 39 of FIG. 2 is shown in FIG. 3. The serial lines of connector 35 from the host system as an external source are connected to a serial interface integrated circuit 45 in unit 15. Serial interface circuit 45 provides the received filter coefficients in parallel form along a data bus 47 to all-hardware circuit 43. A random access memory (RAM) 49 holds coefficient data which have been downloaded from the host system. RAM 49 is supplied with voltage V through a diode 51. When the external connector 35 is being replaced with connector 39, RAM 49 retains the coefficients by using temporary power from a small battery 53.

All-hardware circuit 43 processes digitized audio information from input microphone 13. Microphone 13 is suitably an electret microphone which receives battery voltage V for operating power and provides an output to an anti-aliasing low pass filter (LPF) 59 which has a cutoff frequency of 6 kiloHertz. LPF 59 in turn feeds a sample and hold circuit S/H 61. S/H 61 in turn feeds analog samples to an analog-to-digital converter (ADC) 63 which converts the samples to digital form and temporarily holds them in an ADC output register The samples are provided from the ADC register to the all-hardware circuit 43. Circuit 43 processes them and supplies a digital output, corresponding to filtered and amplified external sound with feedback offset, to a digital to analog converter (DAC) 65. The analog output of DAC 65 is fed to an analog active filter (AAF) 67 which amplifies the analog output and drives receiver 17 through a blocking capacitor 69. Receiver 17 produces sound corresponding to the analog output for the ear as described in connection with FIG. 1. Unavoidable feedback to the input microphone 13 is indicated by curved feedback arrow 44 of FIG. 3.

All-hardware circuit 43 of FIG. 3 has an associated clock and decoder circuit 81 and a control latch 83. Circuit 81 provides clock pulses to all-hardware circuit 43 on a line 85 and various control pulses for operating serial interface 45 via a line 87. Sample and hold circuit 61 is controlled via a line 89 from control latch 83, which in turn is controlled by circuit 81 through a decoder output line 91. ADC 63 is controlled via a line 93 from control latch 83. Circuit 81 also clocks the output register REG of ADC 63 via a line 95. Circuit 81 further clocks DAC 65 through a line 97. The details of the control circuitry, as well as of a power-on reset circuit POR, are suitably provided in a conventional manner and need not be discussed further herein.

Figure 4:
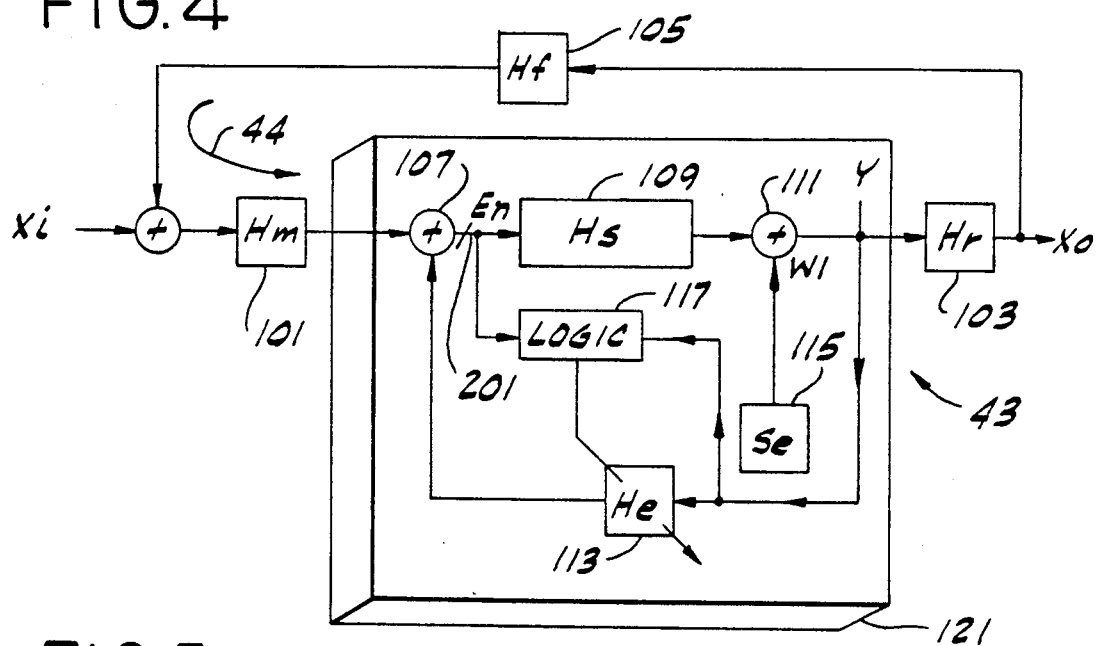
FIG. 4 is an electrical block diagram of an inventive all-hardware circuit for the electronic filter of FIG. 3.

In FIG. 4 further details of the all-hardware circuit 43 are illustrated, together with blocks indicating the transfer functions of the microphone 13 and receiver 17.

External sound Xi is converted by microphone 13 and circuits 61 and 63 of FIG. 3 to digital electrical form for circuit 43 according to a transfer function Hm indicated by block 101 of FIG. 4. A further transfer function Hr indicated by block 103 represents conversion by DAC 65, additional amplification by AAF 67 beyond that provided by circuit 43, and transducer action by receiver 17. Part of a resulting acoustic output Xo from receiver 17 is fed back according to another transfer function Hf block 105 and inherently acoustically summed at the input microphone 13 (Hm 101). Accordingly feedback contribution 44 is mingled with the external sound Xi when it reaches all-hardware circuit 43.

The digital output of block 101 is fed to a combining circuit such as a summer 107 of circuit 43. The output of combining circuit 107 is designated En and is supplied to a digital filter 109 operating according to the data in RAM 49 of FIG. 3 to ameliorate the hearing deficiencies of the user. This digital filter 109 has a transfer function Hs. The output of filter 109 constitutes a filtered signal which is supplied to an additional combining circuit 111 that produces an output Y to drive the Hr block 103. The circuitry with elements 107, 109 and 111 is an example of a first means (107, 109, 111) for electronic processing of the electrical output of the microphone to produce a filtered signal and for combining the filtered signal with a second distinct signal for the receiver of the hearing aid. Filter 109 and combining circuit 111 also act as an example of a means for amplifying the electrical output of the microphone to produce an amplified signal and for combining the amplified signal with a pseudorandom noise signal to produce a combined amplified signal for the receiver.

In this preferred embodiment of FIG. 4 the output Y is further also fed back through a special adaptive filter 113, with transfer function He, which continually and variably further filters the output Y and produces a resulting output of its own for the combining circuit 107. The output of adaptive filter 113 thereby substantially offsets the feedback contribution 44 from block 105 even though not only the level but also the transfer function Hf of that feedback is changing with time.

For example, when the user sits near a wall the feedback transfer function Hf is different from Hf when the user is in the center of a large room. The user also changes the feedback path and thus Hf by moving a hand near the ear, or by chewing or otherwise moving the jaw or in numerous other ways, in the daily life routine. Remarkably the adaptive filter 113 offsets this varying feedback in a manner which considerably increases the convenience and value of the hearing aid to the user.

Control for adaptive filter 113 involves a pseudorandom noise generator 115 and a logic circuit 117. Noise generator 115 produces a digital pseudorandom noise signal Se, which is supplied to combining circuit 111 and there weighted by an appropriate weight W1 (or multiplying factor) for the pseudorandom noise signal so that the output of combining circuit 111 is $$Y = Hs*En + W1 \cdot Se \qquad (1)$$

where Y is the output of circuit 111, En is the combined signal input processed by the filter function Hs, W1 is a weight multiplied by pseudorandom noise Se, which is a function of sample number n. Asterisk "*" refers to convolution, as discussed hereinbelow in connection with FIG. 6.

The Y output of combining circuit 111 is provided to logic circuit 117 which has as an additional input a single one of the bits of input signal En. Logic circuit 117 acts as a controller for the adaptive filter 113, which remarkably varies the transfer function He of filter 113 to equal (or mimic) the feedback loop transfer function HrHfHm as Hf varies. In this way the feedback can be offset at all times by the output of filter 113 to combining circuit 107.

Advantageously, pseudorandom noise Se is thus supplied to the hearing aid circuitry at combining circuit 111 as a second electrical signal (or probe signal) that probes the feedback path Hf 105 since some sound corresponding to the probe signal is emitted by receiver 17 along with amplified speech. Also, the noise is acoustically fed back to the microphone 13 with the rest of feedback contribution 44 and becomes included in signal En to which the logic circuitry 117 that controls filter 113 responds.

The block diagram of FIG. 4 is illustrative of both inventive apparatus and methods for use in hearing aid applications and is also applicable in systems generally in which instability occurs because of undesirable coupling between output and input transducers, such as often occurs in public address systems.

Key parts of the apparatus and process are illustrated in FIG. 4 and include excitation source Se 115 and adaptive equalization filter 113 with transfer function He. Other parts in FIG. 4 represent the input signal Xi, input transducer and circuit Hm 101, system process Hs 109, output circuit and transducer Hr 103, output signal Xo, and undesirable external feedback path with transfer function Hf 105. The adaptive process is such that the error signal En is minimized in the least mean square sense by adjusting the coefficients of the filter transfer function He to offset or cancel the presence of the external feedback path, assuming a zero mean signal at the output of Hm. Adjustment of the filter coefficients in filter 113 of FIG. 4 is accomplished according to the recursive expression:

$$C_i(n+1) = C_i(n) = \lambda \cdot sgn[En \cdot y(n-i)] \quad (2)$$

where $C_i(n+1)$ represents the ith coefficient at sample number $n+1$, $C_i(n)$ represents the ith coefficient at sample number n, En represents the error (also called combined signal input herein) at sample number n, and $Y(n-i)$ represents the input to the filter at sample number $n-i$. The second term on the right of the equation adds or subtracts a positive constant $\lambda$ (lambda) to each ith coefficient depending on the s of the product term. In this way the coefficients are adjusted over time to minimize the mean square of the error En, which is primarily the difference between the signals due to the external feedback path and the internal adaptive filtering path (also called an equalization path herein) if the external input Xi be ignored. The influence of the externally derived signal Xi is minimized by the combined signal delay through system process Hs and either feedback path Hf or adaptive filter path He. The system readily accommodates the addition of extra delay in system process Hs or in series with system process Hs as desired to even further reduce any effect of the external signal Xi.

The recursive expression in the above equation (2) is uncomplicated and is economically implemented in VLSI (very large scale integration) form. Calculation of the sign of the product term is readily accomplished with an exclusive-or logical operation on the polarity information in error signal En and each sample of output Y represented by $Y(n-i)$ going back in time from latest value n (i=0). When lambda is made to be unity, updating each coefficient is an up-down counter operation that is controlled by the sign of the product term. The rate of adaption is determined by the recursion rate, or clock rate in the electronic embodiments.

In FIG. 4, circuit elements 107, 109, 111, 113, 115 and 117 are implemented in VLSI on a VLSI die or substrate 121. A discussion of VLSI principles which is generally available to workers in the field is found in C. A. Meade, Introduction to VLSI Systems, Addison-Wesley, 1980, see for instance pages 60-84, 91-115, 155-164 and Plates 1-15. System process Hs 109 is implemented as a first all-hardware digital filter in combination with summer 107 and combining circuit 111 for electronic processing of the electrical output of the microphone in accordance with a first series of digital coefficients to produce a filtered signal and for combining the filtered signal with a second distinct signal for the receiver. Adaptive filter He 113 is also implemented as a second all-hardware digital filter united with and connected to the first all-hardware digital filter as one VLSI circuit on die or substrate 121, for electronic processing of the filtered signal and second distinct signal in accordance with a second series of digital coefficients to produce an adaptive output. The adaptive output is combined with the microphone output, to produce a combined signal input for the first digital filter, by combining circuit 107 which is suitably also laid down on die 121 with such other elements in FIG. 3 as maximize convenience, economy and reliability Further, circuit 117 is implemented as an all-hardware logic circuit united with and connected to the first all-hardware digital filter log for adaptively varying the digital coefficients of the second all-hardware digital filter 113 as a function of the combined signal input so that the adaptive output substantially offsets the feedback contribution in the electrical output of the microphone.

Adaptive filter 113 is thus an example of a digital adaptive filter means, interconnected with the first means, for electronic processing of the filtered signal and second distinct signal to produce an adaptive output to the first means (017, 109, 111) to substantially offset the feedback contribution in the electrical output of the microphone means in the hearing aid, the digital adaptive filter means including means for adapting only in response to polarities of signals supplied to and from said first means.

In logic circuit 117, the coefficient updating for filter 113 is suitably accomplished by implementing an adder-subtractor in which case the positive integer lambda 1 is added to or subtracted from particular ith coefficient value depending on the sign of the product of En with $Y(n-i)$. In this case the rate of adaption is determined by the recursion (clock) rate and the magnitude of lambda 1.

An excitation signal such as Se that drives the adaptive process is readily implemented as a pseudorandom maximal-length sequence which has values of plus and minus one (1), with a zero mean, and is very wideband with a flat spectrum. Illustratively, this signal Se is produced by a 15-bit shift register with a two-input exclusive-OR gate fed from arbitrarily selected bit positions (e.g., 1 and 3) on the shift register The output of the exclusive-OR gate is connected t the input of the shift register. The shift register generates a pseudorandom signal that repeats only after $2^{15}-1$ cycles or bits. The excitation signal Se can be provided at a low level so that it is below threshold for users with severe hearing impairment or near threshold in which case it is perceived as a low-level sound, such as a white noise when noise is used.

In one embodiment of FIG. 4 a clock rate of 12.5 kiloHertz (twice the Nyquist rate of at least the frequency of the highest audio component to be sampled) is derived from circuit 81 of FIG. 3. Adaptive filter 113 is a digital finite impulse response (FIR) filter with a register length of 20 stages and preferably even 40 stages. Sound in air takes about 30 microseconds to travel one centimeter. A clock rate of 12.5 kiloHertz is 80 microseconds per repetition period and thus 80 microseconds per filter 113 register stage. This means that each register stage is a snapshot of the feedback (mixed up with the external input to be sure) each 80 microseconds, and thus about every 2 or 3 centimeters of acoustic delay in the feedback path is mapped into the shift register in addition to the delay through receiver 17. Consequently, an acoustic feedback path roundtrip length of illustratively as much as 54 centimeters and more is readily accommodated with 20-stage FIR adaptive feedback filtering in this way. Since reflections from substantially greater distances are likely to be low in amplitude in hearing aid applications, such long-distance reflections are unlikely to materially exacerbate a feedback condition. Adaptation to obtain a new set of He coefficients when the feedback path changes is preferably accomplished in less than about 2 seconds and even more preferably in less than a second.

The system of FIG. 4 and the adaptive process or method also represented by the above equation and description were implemented and evaluated on a laboratory-based digital signal processing system and on an experimental wearable digital hearing aid. In both implementations an ear module consisting of a microphone and receiver as in FIG. 2 in an in-the-ear module and a second version consisting of a microphone and receiver in a behind-the-ear module coupled acoustically to the ear were used. In both instances the hearing aid gain Hs could be adjusted so that oscillation due to acoustic feedback between receiver and microphone occurred in the absence of equalization or offsetting. When the offsetting process was used under the same conditions by introducing adaptive feedback filtering as disclosed herein, oscillation ceased.

The performance of the adaptive system is excellent. The apparatus and process are stable over a wide range of system gains, system transfer characteristics and adaption rates. The adaptive system does not require that the system process Hs be linear, and indeed in FIG. 5 a system process Hs is shown that includes nonlinear limiter elements. The adaptive filter 113 coefficients can be updated singly upon the occurrence of each latest sample, or they can be updated as a whole or together essentially simultaneously after a period of time when many samples have arrived. Mixtures of these two processes are also feasible. The updating of individual coefficients can occur by independent processes. Accordingly, numerous embodiments of the invention are made available to the skilled worker.

Any self oscillation which occurs when the undesirable, external feedback characteristic Hf changes suddenly, if such oscillation occurs at all, is accommodated by the apparatus and processes disclosed herein. The self oscillation signal would act and does act as a distinct signal from the sound which is to be amplified by the hearing aid, and is thus treated in similar fashion to already present distinct signal Se. Therefore, when any accidental oscillations occur briefly, if at all, the system continues to adapt to an equalized state of complete offset of feedback, and no auxiliary circuits and processing to detect and inhibit self oscillation are needed.

The system of FIG. 4 not only prevents self-oscillation, but also equalizes or adjusts the system to prevent underdamped or near-oscillatory conditions from occurring. In conventional hearing aids, near oscillatory conditions result in undesirable signal distortion and poor performance.

Figure 5:
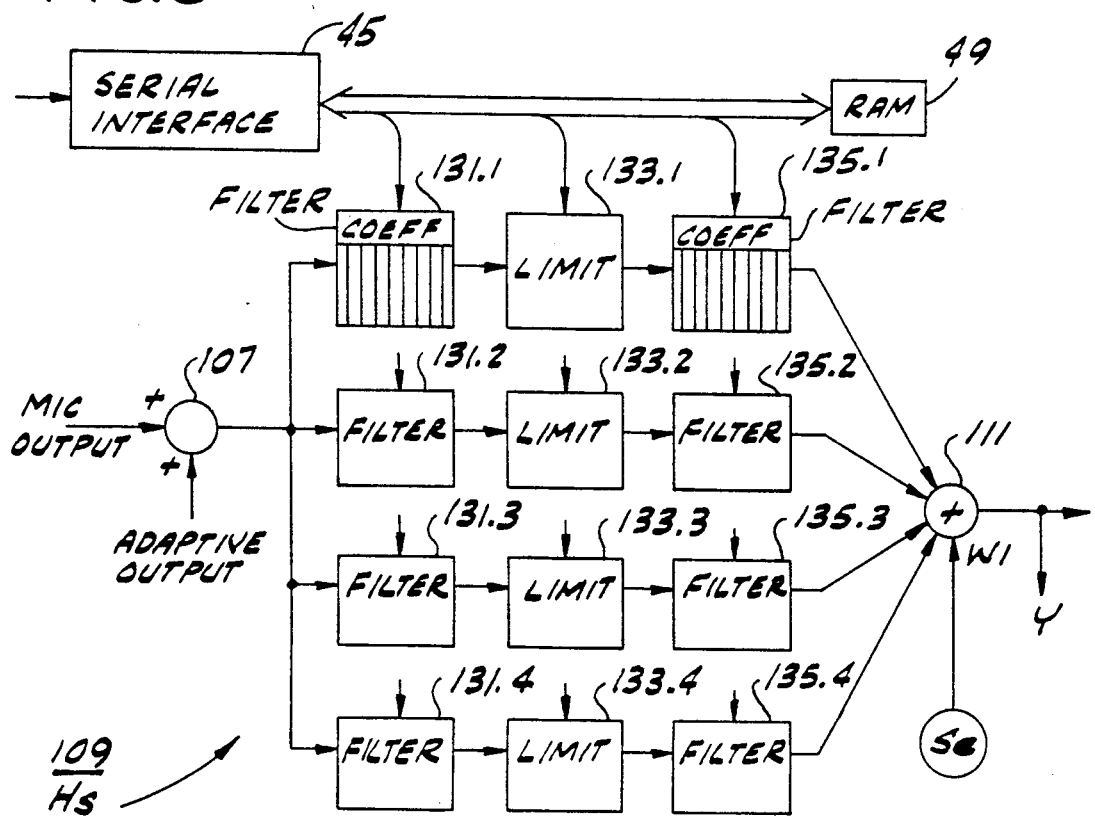
FIG. 5 is an electrical block diagram of a serial interface, random access memory and several filter-limit-filter sections in the electronic filter of FIG. 3.

In FIG. 5 a preferred version of filter 109 of FIG. 4 includes four sections of all-hardware filter-limit-filter hardware blocks operating in four different frequency bands to act as a four-channel filter-limit-filter digital filter. As in FIG. 4 the combining circuit 107 adds an adaptive output from block 113 of FIG. 4 to the digitized output of the external microphone 13. Combining circuit 107 feeds each of four finite impulse response (FIR) digital filters 131.1, 131.2, 131.3 and 131.4. Each of these four filters is provided with coefficients from the serial interface 45 of FIG. 3 which are stored in RAM 49. The outputs of the four filters 131.1-0.4 are respectively fed to four limiter circuits 133.1, 133.2, 133.3 and 133.4. The limiters are nonlinear devices which prevent or limit an output from the previous filter blocks from exceeding a predetermined level which also is provided as input data from the serial interface 45 and stored in RAM 49. The outputs of the limiter circuits are in turn respectively fed to additional digital filters 135.1, 135.2, 135.3 and 135.4. Both the filters in the group 131 and filters in the group 135 are suitably finite impulse response (FIR) filters which are tuned according to the coefficients provided to them to establish four contiguous frequency bands generally spanning the audible frequency range. The outputs of the filters 131.1-0.4 are all fed to the combining circuit 111 to which the W1-weighted pseudorandom noise Se is also provided to produce the output Y.

Figure 6:
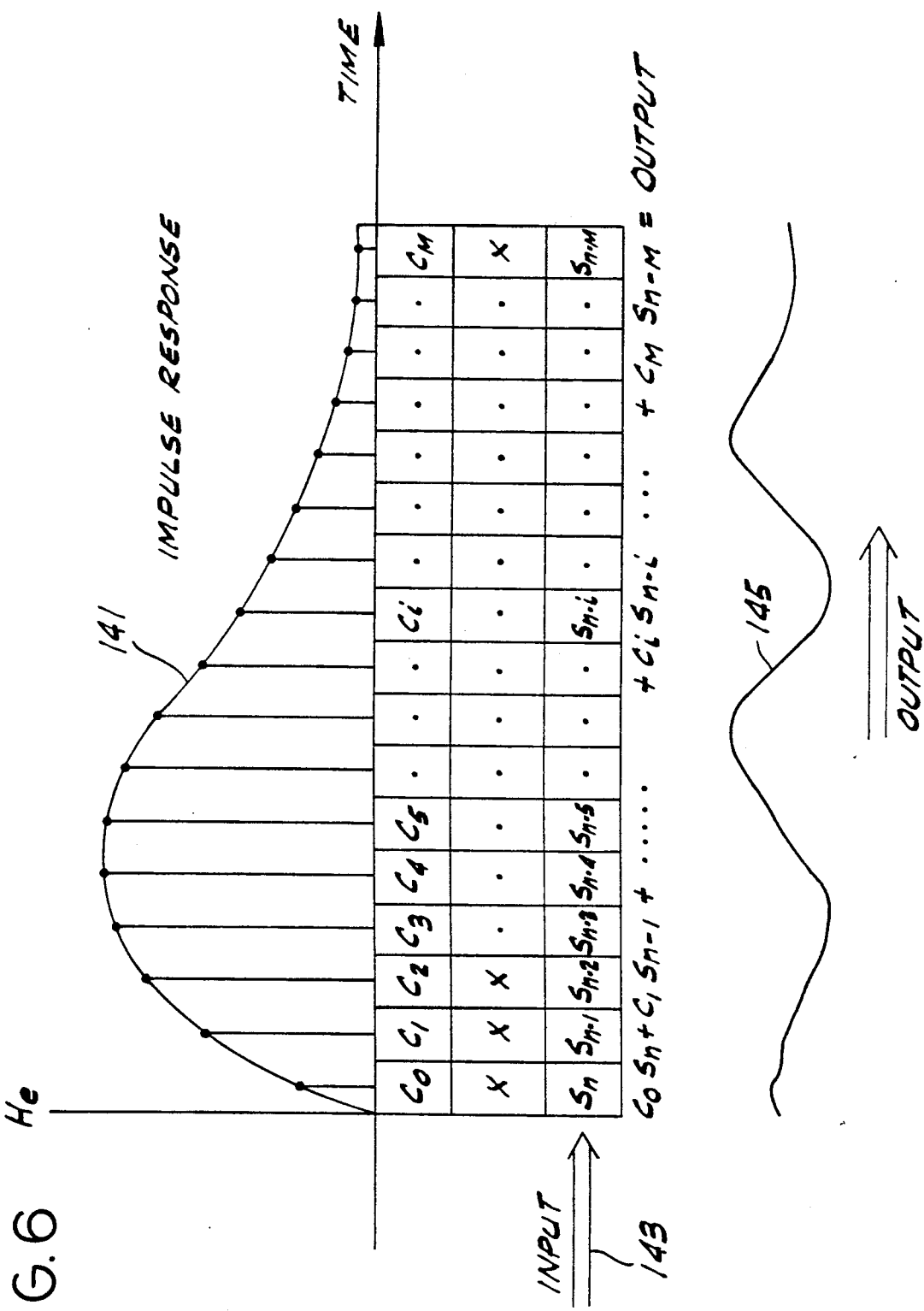
FIG. 6 is a partially graphical, partially block diagrammatic representation of a finite impulse response (FIR) digital filter used in the some of the inventive circuits.

FIG. 6 illustrates principles of operation of finite impulse response (FIR) filters generally and of each and any of the finite impulse response digital filters 113, 131.1-0.4, and 135.1-0.4 of FIGS. 4 and 5 for instance. An impulse response 141 of a filter is the output of the filter when it is excited with a single impulse input (as expressed by a mathematical delta function). The actual input 143 of a real filter in a real application is of course some general voltage over time and not an impulse. However, the actual voltage input over time can be regarded as a succession of impulses. The impulse responses of the filter to the succession of input impulses are curves like impulse response 141, except time-shifted and scaled relative to impulse response 141. These impulse responses are added together in order to determine an output 145 of the filter in response to the actual voltage input over time. The shifting, scaling and adding process is called convolution of the input 143 with impulse response 141.

In FIG. 6 the impulse response 141 illustrated for one example, begins at zero, rises to a peak and then gradually decays away over infinite time. A set of coefficients $C_0, C_1, C_2, C_3, C_4, C_5, \ldots, C_i, \ldots C_M$ of the filter are loaded as digital representations into the RAM 49. The coefficients represent selected values on impulse response 141 over a finite initial length of time, hence the name "finite impulse response" filter.

The input 143 is a series of sample values in digital form which are input to a shift register for holding the digital values beginning with a most recent sample $S_n$ and going backwards in time to previous samples $S_{n-1}$, $S_{n-2}, S_{n-3}, S_{n-4}, S_{n-5}, \ldots S_{n-i} \ldots S_{n-M}$. Multiplying arithmetic logic circuitry and adding circuitry forms the products $C_0 S_n$ plus $C_1 S_{n-1}$ plus $\ldots$ plus $C_i S_{n-i} \ldots$ plus $C_M S_{n-M}$. The just-described sum of products at any given time constitutes the electrical output of the FIR filter at that time. Upon the arrival of an additional input sample all of the samples in the shift register are moved one to the right so that $S_n$ is now the latest most recent sample and $S_{n-1}$ is the sample which was $S_n$ in the previous computation. Then the sum of products is recalculated forming the next successive electrical output of the FIR filter. This process is repeated over time to produce a time-domain output 145 of the FIR filter as shown in FIG. 6.

For brevity FIR filters where used in the present work are simply indicated with blocks, it being understood that the operations and circuitry are provided as appropriate to achieve the filter operation desired. Coefficients are designated for general discussion herein by the letter C with a subscript for the particular coefficient. Coefficients for particular filters are also designated by their transfer function designator followed by parenthesis designating the particular coefficient, e.g. He(M). Coefficients for the filters are varied by associated logic circuitry controlling them, as indicated by a slanting arrow through each filter box. Where no logic circuitry is indicated, and a slanting arrow is used, the logic circuitry is included with the filter and the logic circuitry has two inputs, the first input being from the source of the slanted arrow and the second input being from the input to the filter box.

Figure 7:
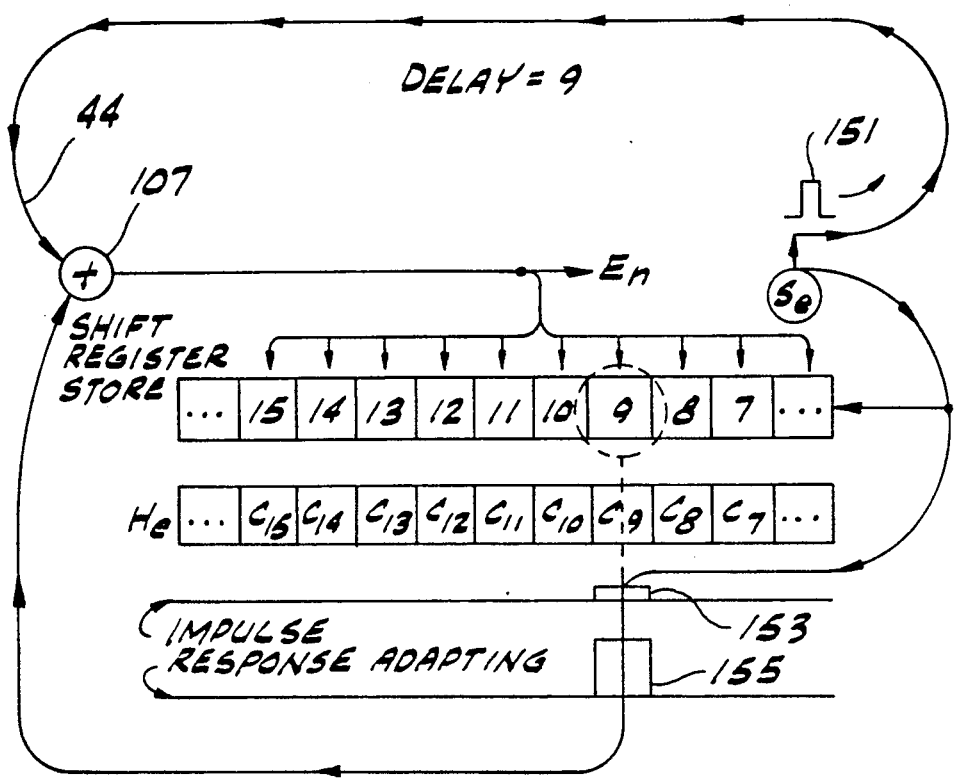
FIG. 7 is partially graphical, partially block diagrammatic illustration of operations in a preferred embodiment for making a digital filter adaptively simulate or mimic the characteristics of a feedback path.

FIG. 7 is an illustration for a heuristic explanation of the adaptive filter operations which are implemented in a preferred embodiment such as that of FIG. 4. Most of the elements of FIG. 4 are suppressed for clarity. The pseudorandom noise signal Se is supplied to the hearing aid system as bipolar pulses, and an individual pulse of this pseudorandom noise is shown entering the hearing aid system as a pulse 151. Measurements on one receiver indicate that it has a linear phase delay of about 480 microseconds, meaning that it produces a sound corresponding to an electrical signal input to it about 480 microseconds later, or 6 time units of 80 microseconds per sample. A sound corresponding to the noise signal Se is included in the sound emitted by the receiver. Some of the sound corresponding to the pseudorandom signal, also referred to as a probe signal, returns to the microphone after a delay period roughly equal to the sum of the 6 time units of delay of the receiver plus more delay attributable to the feedback path.

Figure 8:
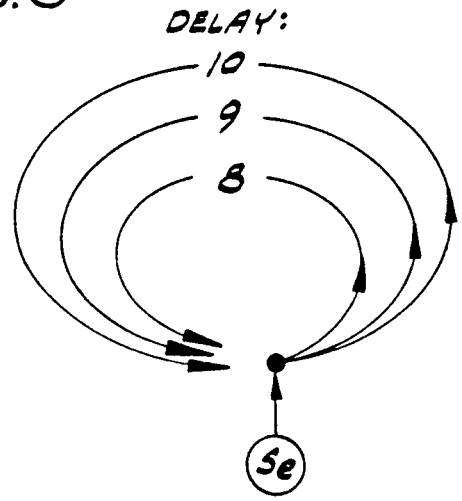
FIG. 8 is a diagram of a feedback path supplied with a probe signal wherein the feedback path has a dispersion that offers many different delays to the same probe signal.

In FIG. 7, the single illustrated pulse 151 passes back to the input microphone and then to combining circuit 107 as part of the feedback contribution 44. It will be understood as shown in FIGS. 1 and 8 that there are actually many acoustic feedback paths of differing propagation delay times among which the impulse 151 becomes divided. The various preferred embodiments remarkably are able to accommodate the very substantial complexity of the many feedback paths. Only three of the feedback paths are shown in FIG. 8 having delays of eight, nine and ten time units, (including 6 units for receiver 17 delay) for instance. Since the coefficients in adaptive filter 113 of FIG. 4 are independently updated, it is sufficient for example to describe the inventive operations in logic circuit 117 with respect to a FIG. 8 portion of the feedback path with 9 time units of delay.

Referring to FIG. 7, a shift register in the logic circuit 117 of FIG. 4 stores the last 20 samples of the pseudorandom noise signal Se (or some signal such as Y that includes Se). Also, the output of combining circuit 107 is fed as combined signal input En to the logic circuit 117. The polarity of combined signal input En is compared with the polarity of each one of the values of the pseudorandom noise signal in the shift register store. The ninth stage in the shift register has a polarity of the pseudorandom noise signal that matches the polarity of the arriving pulse 151 because pulse 151 has been delayed for 9 time units. The comparing process then produces a positive or increasing magnitude of output for the ninth stage which then is used to successively increase the magnitude of the ninth coefficient $C_9$ in the coefficients of FIR digital filter 113.

Figure 9:
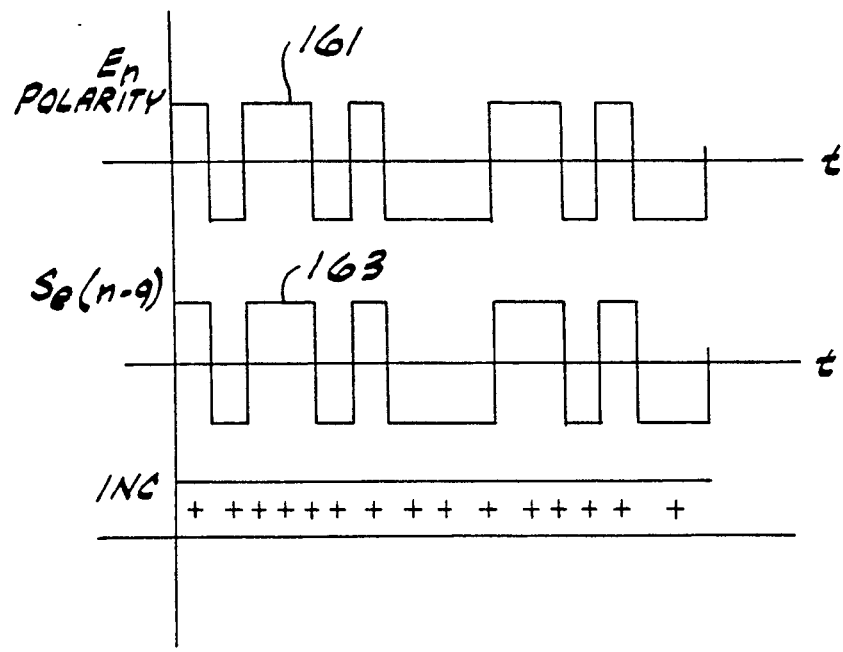
FIG. 9 is three graphs of voltage versus time, the first two graphs showing a combined input signal and a probe signal in synchronism, and the third graph showing a product signal being persistently positive for increasing a filter coefficient for simulating the feedback path.

FIG. 9 illustrates the comparing process A first graph 161 shows a progression of polarities of the input signal En. Another waveform 163 represents the polarity of the ninth stage of the shift register of FIG. 7 over time. The polarities of waveform 163 exactly match those of the waveform 161 at any given time. By multiplication or by an exclusive-OR (or exclusive-NOR) operation, the product of the two waveforms 161 and 163 over time is always positive as represented by incrementing signal INC in FIG. 9. This consistently positive value of incrementing signal INC is used to persistently increase the magnitude of coefficient $C_9$.

Referring again to FIG. 7 the sign of the ninth coefficient is arranged to offset the feedback in combining circuit 107. Since circuit 107 is a summer, the sign of the coefficient is made negative as it increases in magnitude.

Accordingly, coefficient $C_9$ is initially increased to a small value 153 in FIG. 7 since uncancelled feedback is detected in a feedback path with delay of 9 time units.

The signal Y in FIG. 4 includes the pseudorandom noise and is filtered by adaptive filter 113 according to coefficient $C_9$, among other coefficients That part of the output of filter 113 which has a delay of nine time units due to the action of the coefficient $C_9$ partially offsets the feedback in the part of the feedback path with delay of 9 time units. Since the small value 153 for coefficient $C_9$ is insufficient to provide enough offset to cancel the corresponding feedback, then there will still be uncancelled feedback detected when the polarity of signal En is next compared with the polarity in the ninth stage of the shift register in the logic circuit 117 As time goes on, coefficient $C_9$ consequently becomes increased more and more until it reaches a larger value 155 which successfully cancels the feedback in the path with a delay of nine time units. Once the offsetting is complete, the comparison process in logic circuit 117 produces an output of zero and the coefficient $C_9$ in the filter 113 reaches an equilibrium. If the process overshoots or the acoustic feedback decreases due to activities of the hearing aid user, the magnitude of coefficient $C_9$ is decreased back to equilibrium because the polarity of the feedback becomes consistently opposite to the polarity of the value in the ninth cell of the shift register of logic circuit 117 and the comparing process causes the decrease.

External sound and feedback from feedback paths with other amounts of delay in FIG. 8 average out to zero in the comparison process and produce only statistical fluctuations rather than bias in coefficient $C_9$. FIG. 10 illustrates this averaging process between a feedback component of delay 7 and the polarity in shift register stage 9. In FIG. 10, waveform 163 (polarity of Se in shift register stage 9) and a waveform 165 (polarity of feedback component with delay 7) are compared. The result, unlike the incrementing waveform INC of FIG. 9, is a waveform 167 which is negative about as much of the time as it is positive. Therefore, the coefficient $C_9$, for example, fluctuates somewhat but on average is unaffected by the signal resulting from the feedback path portion having delay equal to 7 or any other delay besides 9 time units.

Reference is made again to FIG. 7. Since all of the other coefficients as well as $C_9$ in the filter 113 are concurrently varied toward their equilibria by analogous processing, the logic circuit 117 in effect causes adaptive filter 113 to simulate or mimic the impulse response of the entire feedback path to the extent of available coefficients, taps, or length, in the FIR filter 113. Moreover, since all the coefficients are varied toward equilibrium values which offset and cancel the probe signal returning by acoustic feedback, they are of necessity the correct values to offset and cancel the feedback of the external sound itself, thus eliminating the entire feedback contribution in the hearing aid.

As thus described, the combined signal input (e.g. En) is a digital signal that has a magnitude and includes a polarity signal representing a changing polarity of the combined signal input. The logic circuit 117 has a shift register which acts as an example of a means for temporarily storing a series of values, connected to the first means (e.g. connected to HS 109 and summer 111 of FIG. 4) so that the series of values represent samples of polarity of the filtered signal combined with the second distinct signal, or alternatively represent samples of polarity of the second distinct signal alone. The shift register is also regarded as an example of a means for electronically deriving a series of digital values having polarities responsive to the probe signal The logic circuit also has add/subtract circuitry that increases and decreases each coefficient in magnitude for the all-hardware digital filter. The increasing and decreasing of each coefficient respectively depend on whether a corresponding value in the series of values has the same or opposite polarity compared to the polarity currently represented by the polarity signal. As a result, the He filter 113 acts as an example of a digital filter for electronic processing of the probe signal in accordance with a series of digital coefficients to produce a filter output that substantially offsets the feedback contribution in the electrical output of the microphone in the hearing aid. Remarkably, the preferred embodiments constantly simulate the impulse response of the feedback path as it is at any given time and modify the impulse response as the actual impulse response of the feedback path itself changes during the daily routine of the user, whereby acoustic feedback is offset and eliminated.

To even further illustrate advantageous operation in the presence of external sound such as speech, FIG. 11 provides a graph of an input waveform of speech 171 (dashed), together with a graph (beneath) of pseudorandom noise 173. Adding these two waveforms 171 and 173 together and detecting the polarity of the sum produces a waveform 175. The noise 173 contributes to the polarity of waveform 175 near the zero crossings of the speech waveform 171 Other periods of positive or negative polarity due to the speech cause averaging to zero in the comparing process with noise 173 in logic circuit 117.

FIG. 12 shows a detailed circuit diagram of logic circuit 117 of FIG. 4. Output Y from combining circuit 111 of FIG. 4 is shifted through a storage circuit such as a series of registers 181.0, 181.1, ... and 181.M which are the counterparts of the stages of the shift register of FIG. 6 marked with samples $S_n$, $S_{n-1}$ ... $S_{n-M}$. Polarity signals from each of the registers in the group 181 are respectively supplied to a set of exclusive-OR gates 183.0, 183.1 ... 183.M. The registers in the group 181 are efficiently shared with FIR filter 113 since they hold the samples of the output Y needed for filter 113. A polarity bit from the input signal $E_n$ is provided in common to an additional input of every one of the exclusive-OR gates in the group 183. The exclusive-OR gates in the group 183 have outputs which control add-subtract circuits 185.0, 185.1 ... 185.M. When the polarity of the input signal $E_n$ is the same as the polarity of the contents of any given register, such as 181.1 for example, then the exclusive-OR gate 183.1 produces a low output. Add-subtract circuit 185.1 corresponding thereto is responsive to an input high to add and to an input low to subtract. Accordingly, when the polarity of the input signal $E_n$ is the same as the polarity of the contents of register 181.1, add-subtract circuit 185.1 performs a subtract operation. In the embodiment of FIG. 12, a subtract operation decrements by one as indicated by input from a square block marked "1" for each of the add-subtract circuits in the group 185. In this particular embodiment the increasing and decreasing of each coefficient thus occurs by a predetermined amount (e.g., lambda=1) independent of both the magnitude of the combined signal input and the magnitude of the filtered signal combined with the second distinct signal (e.g. output Y). Repeated subtractions produce a negative coefficient value He(1) for the FIR filter 113 for offsetting purposes A clock output from clock and decoder circuit 81 of FIG. 3 clocks the registers in the group 181 as well as an additional group of registers 187.0, 187.1 ... 187.M respectively fed by the add-subtract circuits 185.0, 185.1 ... 185.M. The outputs of the registers in the group 187 are respectively coupled to an additional input of the corresponding add-subtract circuits in the group 185. As a result of the operations of the logic circuit 117 of FIG. 12, the registers in the group 187 produce outputs which digitally represent the coefficients He(0), He(1), ... He(M) for the adaptive filter 113.

If the entire register length of each register 187.0, 187.1 ... 187.M is used to represent the value of each filter coefficient, then a degree of statistical fluctuation can occur in each coefficient in adaptive operations. An uncomplicated approach for reducing statistical fluctuations in coefficients is to connect higher-order bits of each coefficient from each register to FIR filter 113, leaving the two (or other selected number ) lowest order bits (or least significant bits) isolated from FIR filter 113.

The circuitry of FIG. 12 is thus an example of a logic circuit for adaptively varying the digital coefficients of an all-hardware digital filter as a function of polarity of the combined signal input independently of its magnitude so that the adaptive output substantially offsets the feedback contribution in the electrical output of the microphone.

FIG. 13 illustrates circuitry by which the polarity signal En(polarity) of FIG. 12 is derived. The output of combining circuit 107 of FIG. 4 is suitably an 8-line data bus 201 for carrying signal En. In FIG. 13 one of the lines of the data bus 201 represents the polarity or positive or negative character of the input signal En. The rest of the lines collectively carry a parallel digital signal which represents the magnitude of the input signal En.

FIG. 14 illustrates that in other embodiments the input signal En is analog. The analog signal is fed to a comparator 203 which acts as a polarity detector and produces a digital 1 or 0 corresponding to the positive or negative polarity of the input signal En.

Other embodiments for even further improved operation are next discussed. It is desirable to reduce any uncertainty or statistical fluctuations in estimating the filter coefficients that represent a simulation of the external feedback path. For instance, the external sound signal Xi and its amplified counterpart generated by the receiver 17 are believed to introduce some fluctuations, see discussion in connection with FIG. 11. These fluctuations can be reduced by the proper choice of the probe signal level and the combined signal delay of the hearing aid and the external feedback path.

Therefore, improvements of apparatus and method such as: (1) maintaining a constant ratio between the external signal level and the internal excitation signal used to "probe" the feedback path, and (2) to add processing delay so that the autocorrelation of the external signal in the error function (combined signal input En) is small, can be effective in reducing the uncertainty of estimation.

A further measure (3) involves supplying the probe signal such as noise Se, instead of output Y, to logic circuit 117. Since the external signal Xi and the internal probe signal Se are uncorrelated, it is possible to separate the contributions of the external signal Xi and internal probe signal Se to the combined signal input En by directly comparing the signal En with the probe signal Se itself, and thereby advantageously accomplish an operation having the same benefits as cross correlating the signal En with the probe signal itself This can be shown as follows. The signal En in FIG. 4 is given by a sum of convolutions $$En = g1*Xi + g2*Se \qquad (3)$$

where En, Xi and Se are the combined input signal (also called the error signal herein), external signal, and internal probe signal respectively and g1 and g2 are the inverse transforms of a pair of transfer functions G1 and G2 respectively given by $$G1 = Hm/(1 - HsH) \text{ and} \qquad (4)$$

$$G2 = H/(1 - HsH) \qquad (5)$$

where $H = HrHfHm + He$ is the combined transfer function of the external feedback path and the internal equalization feedback path and Hs, Hr and Hm are as shown in FIG. 4.

An even more elaborate analysis establishes G1 and G2 by recognizing that $$(Xi + HfHr(HsEn + Se))Hm + He(HsEn + Se) = En \qquad (6)$$

Rearranging yields $$XiHm + (fHrHm + He)Se = En(1 - HeHs - HfHrHsHm) \qquad (7)$$

Dividing through by the parenthesized quantity after En and comparing with the hereinabove defining equation for G1 and G2 yields $$G1 = Hm/(1 - HeHs - HfHrHsHm) \qquad (8)$$

$$G2 = (HfHrHm + He)/(1 - HeHs - HfHrHsHm) \qquad (9)$$

A cross-correlation of the error signal En with the probe signal Se produces $$E[En(n) \cdot Se(n-i)] = g2(i) \qquad (10)$$

because the probe signal is uncorrelated with the input signal Xi and the term involving g1 advantageously vanishes.

Accordingly, g2(i) thus obtained is an unbiased estimator of the difference between the external feedback path and the internal equalization path. Therefore, g2(i) can be used to adaptively adjust the coefficients of the adaptive filter or equalization filter to cancel the external feedback path according to an adjustment process defined by $$He(j+1) = He(j) - g2(j) \qquad (11)$$

where He refers to the vector of coefficients (and not to the transfer function itself in the Laplace or z domain) and j is an iteration index in the adjustment process and not a designator (like index i) of a particular coefficient. g2(j) refers to the vector of cross-correlations at iteration j.

When g2 is reduced to the zero vector, the adaptive filter transfer function He in this example cancels the feedback path according to the equation (involving the transfer functions themselves and not their inverse transforms)

$$He = -HrHfHm \qquad (12)$$

"Equalization" as the term is used herein, refers to the process of making the coefficients of the adaptive filter process simulate the coefficients which would describe the path HrHfHm so that feedback can be offset by subtraction, summation or any other combining process, and is not to be confused with equalization as the term is used in some other contexts in the literature for series filtering of communication channels, for instance.

These processes can be implemented by a variety of apparatus embodiments. In one embodiment, an electronic block computation of cross correlation is performed over one period of the probe signal which is a maximal-length noise sequence. The resulting values of g2(j) are then subtracted from the coefficients corresponding to He(j) to update the adaptive filter.

FIG. 15 shows a further VLSI embodiment incorporating improvements to reduce fluctuations caused by the external sound in the estimation of the feedback path. Only those circuit portions which are different from the circuitry of FIG. 4 are explained in additional detail. The output of system process digital filter 109 is fed to an additional combining circuit 211 and weighted with a weighting factor W2. Weight W2 is set to some fraction in a range, illustratively, of about 0.1 to 0.5. Pseudorandom noise signal Se is an additional input to the combining circuit 211. At normal levels of speech the weighted contribution of the output of filter 109 does not affect the polarity of its sum in circuit 211 with noise signal Se (see FIG. 18 and discussion later hereinbelow). The output of the combining circuit 211 is fed as a signal U to the logic circuit 117.

Logic circuit 117 operates in generally the same way as described hereinabove in connection with FIGS. 4, 7 and 12. However, in an abnormal situation in hearing aid use, a feedback instability might substantially increase the output of filter 109. The output would then exceed normal speech loudness levels and contribute in a polarity-determinative manner to the output U of combining circuit 211 notwithstanding the fractional value of W2. The input En and the output U would correlate substantially to one another due to the feedback itself Combining circuit 211 thus causes logic circuitry 117 to speed up the adaption process in, the abnormal situation, using the feedback itself for controlling the logic circuitry 117 to eliminate the instability.

In another improvement, noise input weight W1 of combining circuit 111 of FIG. 15 is made variable by adding an automatic gain control (AGC) circuit 215. AGC circuit 215 is responsive to output S of system filter 109. AGC circuit 215 is made to operate so that the amount of pseudorandom noise signal Se which is combined with the output S of filter 109 increases directly with average sound volume level in the output S. In this way, when the external sound is faint, there is less pseudorandom noise injected into the hearing aid circuit. Advantageously, the presence of the pseudorandom noise signal becomes less noticeable at such times due to the action of automatic gain control circuit 215.

On the other hand, when sound output S of filter 109 has greater magnitude due to loud external sounds, a substantial amount of pseudorandom noise signal is injected into the hearing aid circuit at combining circuit 111 due to an increased value of weight W1 established by the AGC circuit 215 in response to the output S. In this way, a significant presence of the pseudorandom noise signal is established at the zero crossings of speech (compare FIG. 11) at all speech magnitudes, and the operation of logic circuit 117 is made even more reliable and effective in controlling the adaptive filter 113.

ACG circuit 215 suitably has an energy or envelope detector (such as a rectifier and low pass filter) connected to a voltage controlled multiplier connected to the Se noise generator to vary the noise level provided to the input of combining circuit 111 as described herein.

AGC circuit 215 thus is an example of a means for varying the second distinct signal (e.g. Se) in magnitude as a function of the magnitude of the filtered signal, and indeed as a direct function of an average of the magnitude of the filtered signal. Also, the circuitry including combining circuits 111 and 211 constitutes an example of first combining means for combining the filtered signal with a second distinct signal for the receiver of the hearing aid in a proportion wherein the magnitude of the second distinct signal is generally less than the magnitude of the filtered signal at loudness of normal speech and second combining means for combining the filtered signal with the second distinct signal to produce a control signal or second combined signal for affecting the processing by the means for electronic processing (e.g. filter 113) wherein the magnitude of the second distinct signal is generally greater than the magnitude of the filtered signal at loudness of normal speech. The logic circuit 117 of FIG. 15 adaptively varies the filter coefficients He(0), He(1), . . . He(M) of filter 113 as a function of polarity of the second combined signal independently of its magnitude.

Figure 17:
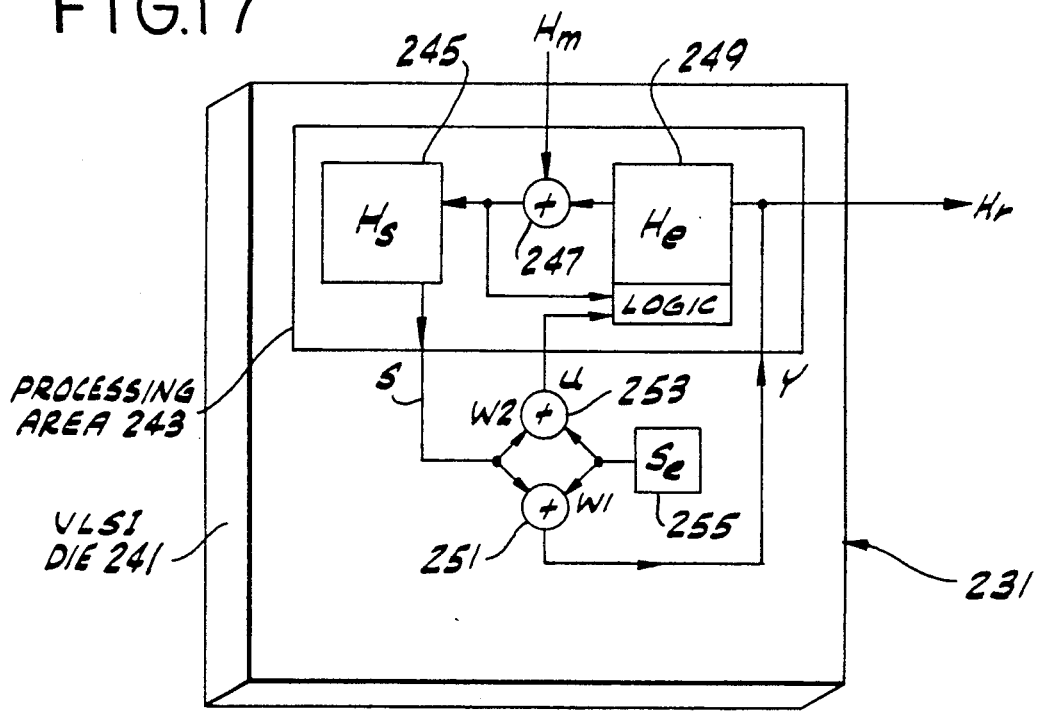
FIG. 17 is a block diagram of another inventive all-hardware circuit on a VLSI die.

FIG. 16 shows an alternative circuit arrangement for logic circuit 117 of FIGS. 4 and 15. Corresponding circuitry is numbered with corresponding numerals in FIG. 16. Add-subtract circuits in the group 185 are supplied with inputs that are produced by a set of multiplying circuits 221.0, 221.1 . . . 212.n which have one input respectively for one or more of the magnitude bits from the corresponding registers in the group 181. The shift register group 181 derives its input either from the input Y of FIG. 4 or the input Y or U of FIG. 15 as the skilled worker elects. An additional input to each of the multiplying circuits 221.0, 221.1, . . . 221.n is derived from the most significant bit (MSB) of the combined input signal En. In this way, the add-subtract circuits in the group 185 increase or decrease their corresponding coefficients in the registers 187, namely, He(0), He(1), . . . and He(M). A greater accuracy of estimation is obtained by the circuit of FIG. 16 at the expense of increased complexity of providing the multiplying circuits FIG. 17 illustrates another all-hardware VLSI processing apparatus 231 according to another preferred embodiment in which a VLSI die 241 has a processing area 243. Processing area 243 includes a circuit 245 for implementing system process Hs filter functions which is fed by the output of a microphone Hm through a combining circuit 247. The output of the combining circuit is also fed to a logic circuit for adaptively controlling an additional filter section He numbered 249. The output of this filter 249 is fed back to combining means 247. Similarly, an output S of filter 245 is supplied to first and second combining circuits 251 and 253. A pseudorandom noise signal generator 255 also feeds combining circuits 251 and 253 respectively. The noise is weighted with weight W1 in combining circuit 251 and the Hs filter output S is weighted with a weight W2 at the input of combining circuit 253. An output Y of combining circuit 251 is supplied to block Hr and also is fed back to filter 249. The LOGIC control block for filter 249 is fed with signal U from combining circuit 253.

In this way, the processing area 243 and its circuitry constitutes an example of a means for electronic processing of the electrical output of the microphone means to produce a filtered signal. The combining circuit 251 acts as an example of a means for combining a filtered signal with a second distinct signal for the receiver of a hearing aid in a proportion wherein the magnitude of the second distinct signal is generally less than the magnitude of the filtered signal at loudness of normal speech. The combining circuit 253 acts as an example of a means for combining the filtered signal with the same second distinct signal to produce a control signal for the means for electronic processing wherein the magnitude of the second distinct signal is generally greater than the magnitude of the filtered signal at loudness of normal speech.

Figure 18:
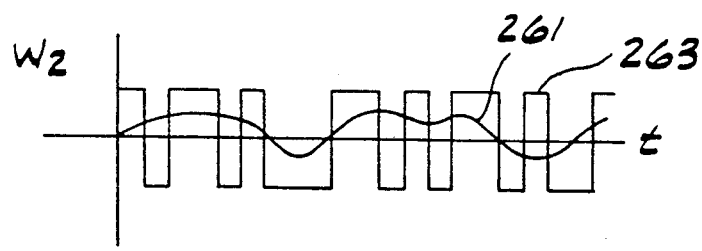
FIG. 18 is a graph of speech and pseudorandom probe noise components versus time in a combining circuit wherein the magnitude of the noise, as a second distinct signal, is generally greater than the magnitude of the filtered signal at loudness of normal speech.

FIG. 18 shows the relative proportion of normal speech 261 when weighted in accordance with the weight W2 in circuit 211 of FIG. 15 or circuit 253 of FIG. 17. The level of the speech 261 is less than about a half the level of pseudorandom noise 263 of FIG. 18.

Figure 19:
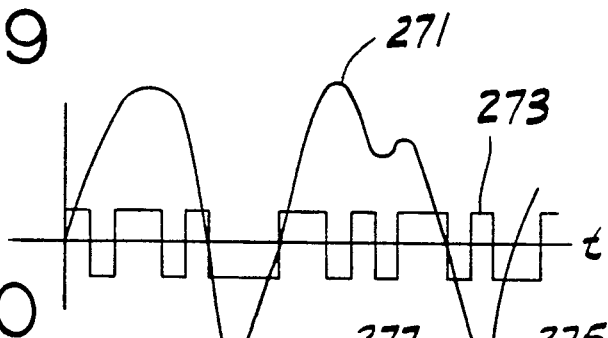
FIGS. 19 and 20 are a pair of graphs of speech and pseudorandom probe noise components versus time in another combining circuit wherein the magnitude of the noise, as a second distinct signal, is generally less the magnitude of the filtered signal at loudness of normal speech, and the magnitude of the noise is varied in magnitude as a function of the magnitude of the speech.
Figure 20:
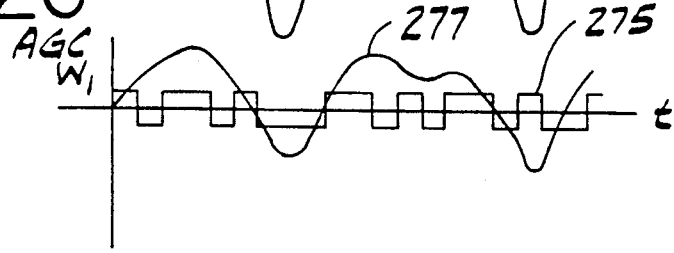

FIG. 19 illustrates the relative proportion of normal speech 271 when pseudorandom noise 273 is combined with weight W1 in circuit 251 of FIG. 17 or circuit 111 of FIG. 15. When the normal speech is at a loud volume the weight W1 is adjusted so that the height of the pseudorandom noise is on the order of one tenth to one half of the amplitude of the speech. However, in FIG. 20 speech 277 at lower loudness levels is also used to control AGC circuit 215 to deemphasize or reduce the level of the noise pulses 275 so that they bear approximately the same proportion to the amplitude of the lower volume speech 277 as noise 273 bears to louder speech 271 of FIG. 19.

Figure 21:
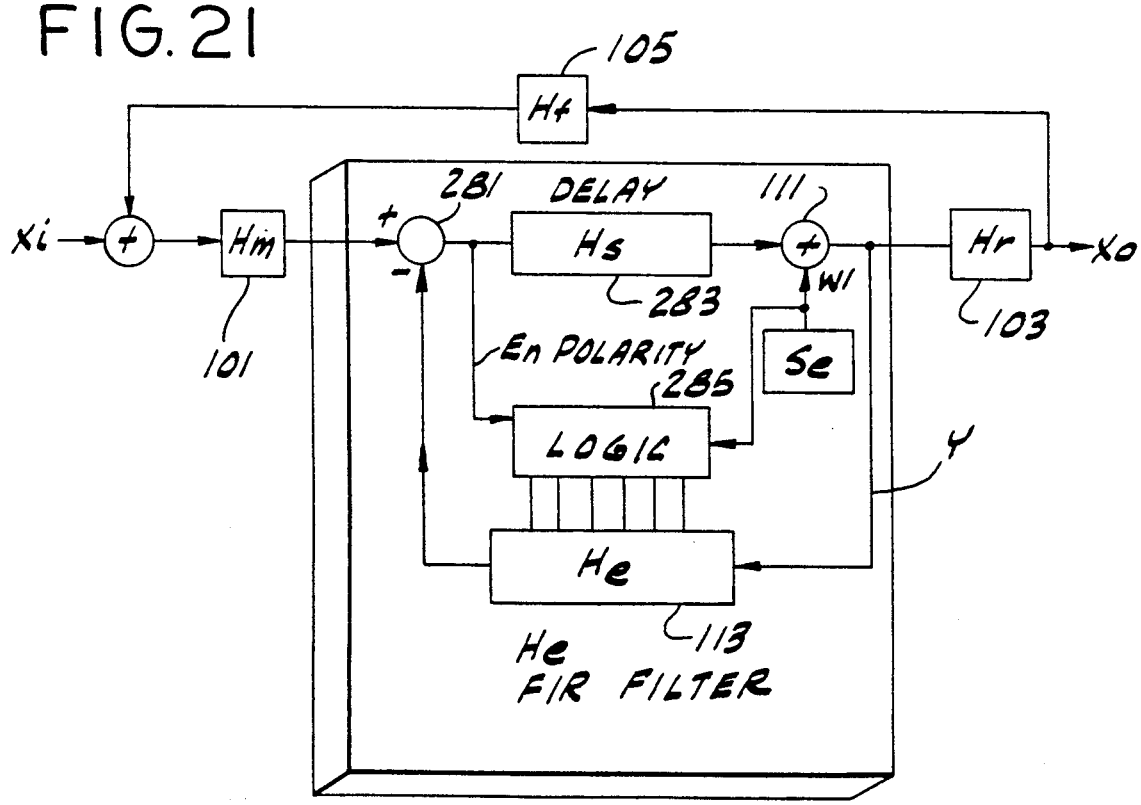
FIG. 21 is a block diagram of an inventive all-hardware circuit on a VLSI die where a subtracter is used as a combining circuit for offsetting the feedback contribution.

FIG. 21 illustrates a circuit in which a combining circuit 281 is implemented as a subtracter instead of a summer at the input of a system process Hs filter 283. In FIG. 21 adaptive FIR filter 113 is driven by a logic circuit 285 which is appropriately modified to take account of the change to a subtracter. The Hs filter 283 suitably has sections of delay added to it in order to even further reduce the likelihood of feedback squealing and instability. Logic circuit 285 acts as an example of a means for temporarily storing a series of values, which temporary storing means is connected to said first means (281, 283, 111) so that the series of values represent samples of polarity of the second distinct signal (e.g. Se), and means for increasing and decreasing each coefficient in magnitude for all-hardware digital filter means by a function of the combined signal input, the increasing and decreasing of each coefficient respectively depending on whether a corresponding value in the series of values has the same or opposite polarity compared to a polarity signal representing the polarity of the combined signal input.

Figure 22:
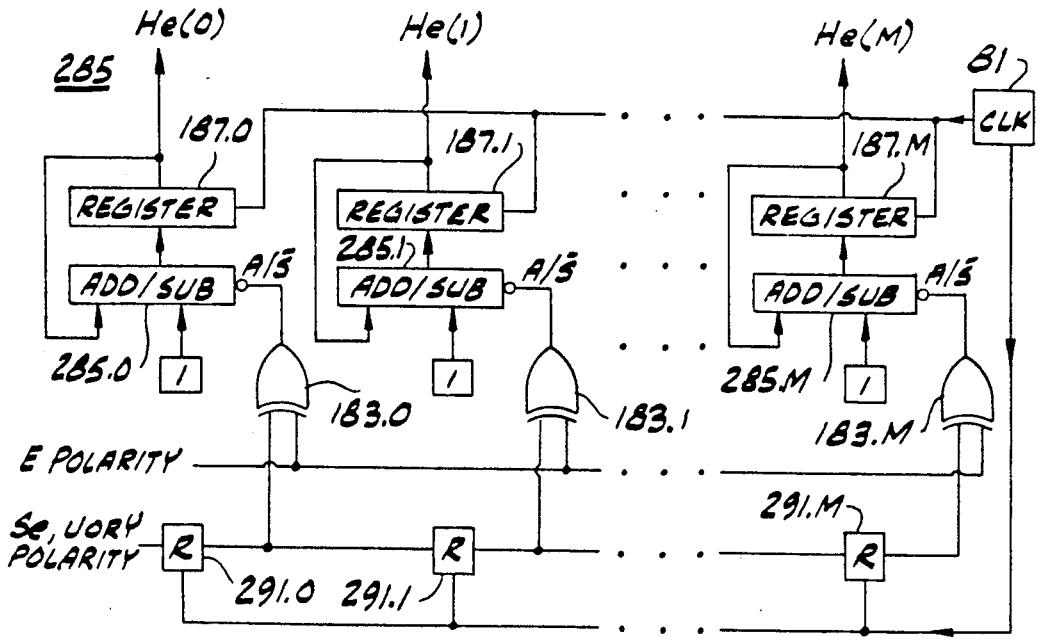
FIG. 22 is a partially block, partially schematic diagram of an inventive logic circuit for use in the circuit of FIG. 21.

In FIG. 22 logic circuitry 285 of FIG. 21 is detailed. The logic circuitry 285 of FIG. 22 is analogous to the circuitry of FIG. 12 except that a set of add/subtract units 285.0, 285.1, . . . 285.M are substituted for the units in the group 185 of FIG. 12. As indicated by control input "bubbles," the add/subtract units in the group 285 of FIG. 22 have their control input low active for addition instead of subtraction, and high active for subtraction instead of addition. This means that an add/subtract unit in FIG. 22 adds when the output of its controlling exclusive OR gate is low instead of when it is high as in FIG. 12. The result is that the coefficients of the adaptive filter 113 of FIG. 21 have the opposite sign from the coefficients which are generated by logic circuit 117 of FIG. 12 for the adaptive filter 113 of FIG. 4.

The output of the FIR filter 113 of FIG. 21 is thus made of the appropriate sign to operate the subtracting circuit 281 of FIG. 21 in a manner to effectively offset the feedback contribution. By way of comparison, in FIG. 4 the output of the FIR filter 113 is of the proper sign to cooperate with a summing circuit used as the combining circuit 107 of FIG. 4.

Circuitry 285 in FIG. 22 constitutes an example of a means for adapting only in response to polarities of signals supplied to and from first filter means (e.g., filter 283 of FIG. 21). Each of the exclusive-OR gates 183.0, 183.1, ... 183.n is supplied with a single line carrying a digital signal representative of the polarity of the combined input signal En. A series of D latches 291.0, 291.1, ... 291.M are connected as a shift register to hold digital signals respective of the polarity history of any appropriate signal with which signal En is to be compared. An appropriate signal is any of noise signal Se, or signal U of FIG. 17 or signal Y of FIGS. 4, 17 or 21, for example. The signal utilized is supplied to the first D-latch or bit register 291.0 and then the successive polarities of this signal are shifted into the rest of the registers 291.1 to 291.n. A signal from the clock circuit 81 of FIG. 3 is connected to clock the registers in the group 187 and the D-latches in the group 291 in FIG. 22. In this way, the coefficients of the impulse response for adaptive filter 113 are successively increased and decreased according to the principles discussed in connection with FIGS. 6, 7, 9 and 10.

Figure 23:
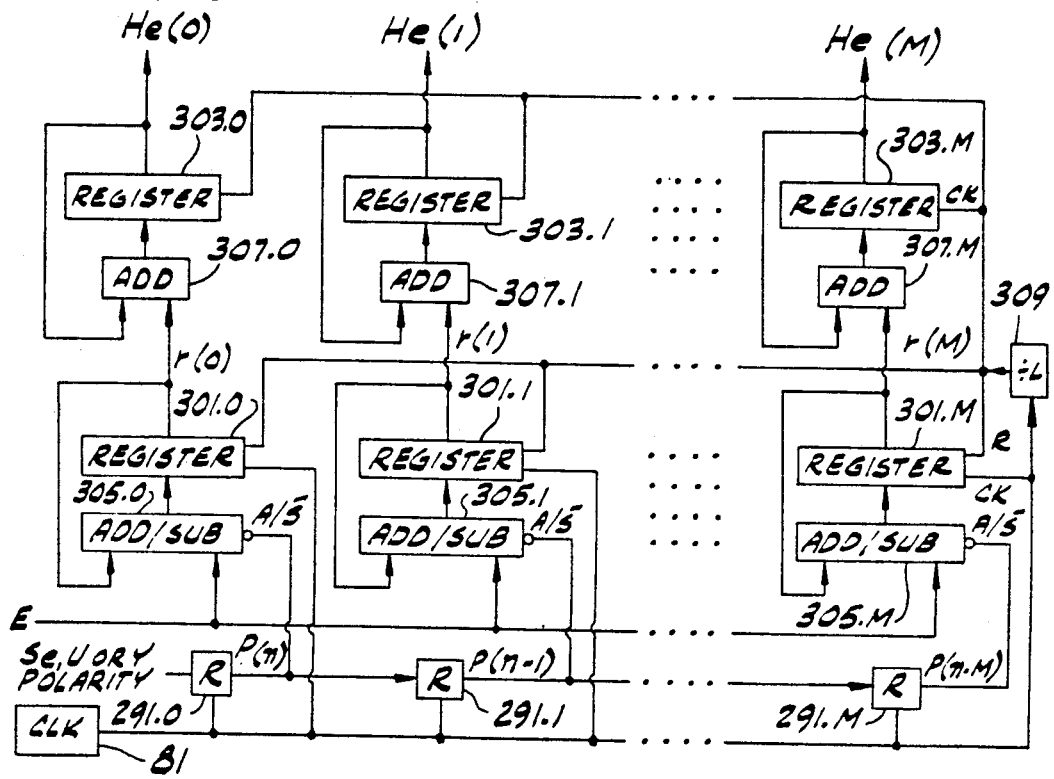
FIG. 23 is a partially block, partially schematic diagram of an inventive logic circuit for producing running totals and adding them to coefficients for a digital filter from time to time.

FIG. 23 shows an embodiment for reducing statistical fluctuations by keeping running totals in a first set of registers 301.0, 301.1, ... 301.M and updating the coefficients He(0), He(1), ... He(M) less frequently in a second set of registers 303.0, 303.1, ... 303.M. A set of add/subtract circuits 305.0, 305.1, ... 305.M increase and decrease each running total in the first set of registers 301.0, 301.1, 301.M by the value of combined signal input En, including sign and magnitude, depending on whether a corresponding value in the series of digital values such as polarity of Se, U or Y in the shift register 291.0, 291.1, ... 291.M have the same or opposite polarity compared to combined signal input En.

In the embodiment of FIG. 23 the exclusive-OR gates in the group 183 of FIG. 22 are omitted. Instead combined signal input En is itself supplied to every one of the add/subtract circuits in the group 305. In this way the add/subtract circuits are an example of means responsive to the temporarily stored series of digital values representing polarities of the pseudorandom noise signal for increasing or decreasing each running total in magnitude by an amount directly related to the magnitude of the combined signal input.

The stages of the shift register 291 are supplied to low active Add inputs of the add/subtract circuits 305 respectively. A clock circuit 81 provides clock pulses for actuating all of the stages in the shift register 291 as well as all of the registers in the group 301. The output of every register in the group 301 is connected back to its corresponding add/subtract circuit 305.0, 305.1, ... 305.M respectively so that running totals r(0), r(1), ... r(M) have the value of signal En added to or subtracted from them.

Running totals r(0), r(1), ... r(M) in the registers in the group 301 as a first set of registers are respectively supplied to corresponding adding logic circuits 307.0, 307.1, ... 307.M. Each of the second set of registers in the group 303 for holding coefficients has its output connected to the corresponding input of the add circuits in the group 307. A divide-by-L circuit 309 has an input connected to the clock circuit 81 to divide the clock pulses by a constant L such as 20. Circuit 309 initiates updating of registers 303 by adding the running totals respectively to the coefficients, and then resets the running totals to zero in the registers in the group 301 at intervals.

In this way, the divide by L circuit 309 together with the add/subtract circuits in the group 307 constitute an example of a means for respectively adding the running totals in the first set of registers (e.g., group 301) to the coefficients in the second set of registers (e.g., the group 303) to update the coefficients for the digital filter (e.g., filter 113) less frequently than the increasing and decreasing of the first set of registers occurs. Circuit 309 is an example of a means for frequency dividing the clock pulses to supply a second set of clock pulses to the second set of registers to update them at a frequency divided rate from the means for adding. Clock circuit 81 is an example of a means for supplying clock pulses to initiate the incrementing and decrementing of the first set of registers.

This type of operation advantageously averages out statistical fluctuations in the running totals as they are developed. The operation thereby produces a more effective offsetting of the feedback contribution and decreases the frequency at which the coefficients are updated. The statistical fluctuations are believed to be reduced by a factor on the order of the reciprocal of the square root of L, which is a percentage reduction of over 75% when $L=20$.

Figure 24:
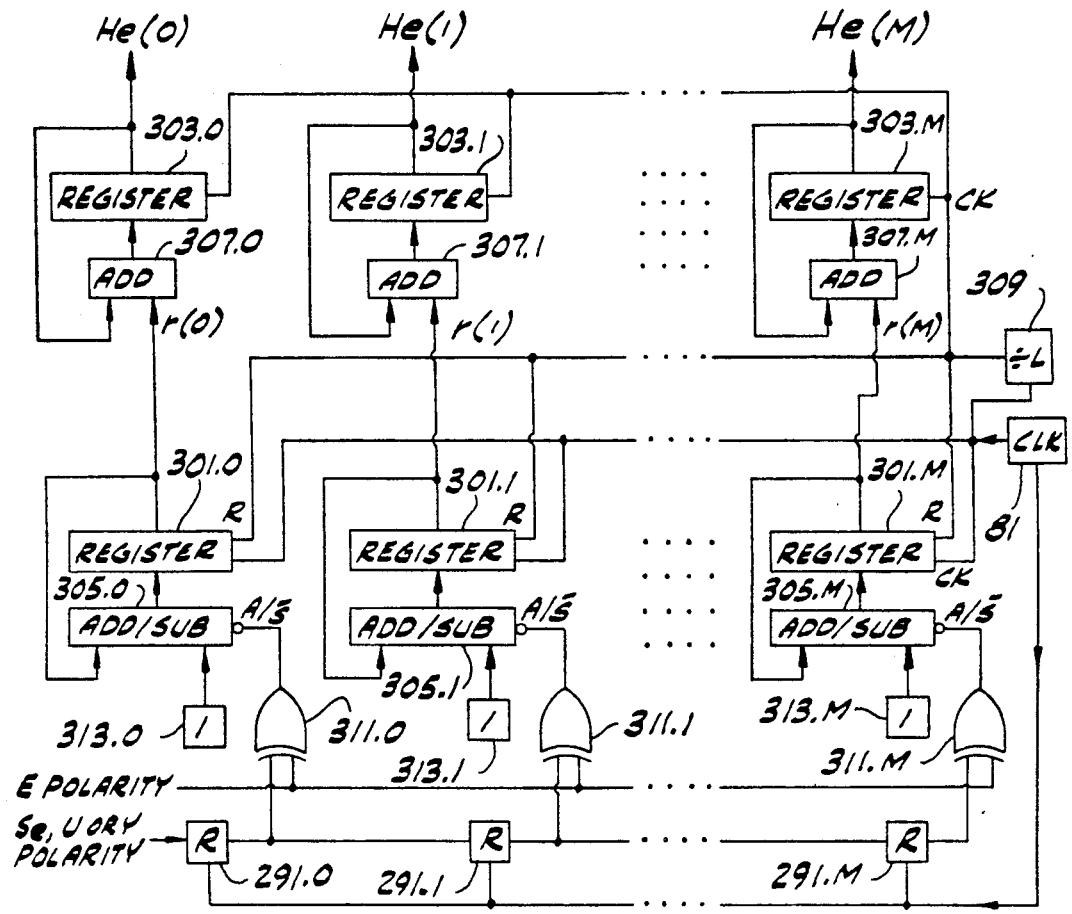
FIG. 24 is a partially block, partially schematic diagram of another inventive logic circuit for producing running totals and adding them to coefficients for a digital filter from time to time.

In FIG. 24 a polarity-only version of the circuitry of FIG. 23 is illustrated. The circuitry is the same as FIG. 23 and numerals are provided identically to corresponding elements. Only the polarity component of the input signal En is connected to a series of exclusive-OR gates 311.0, 311.1, ... 311.M. The outputs of the exclusive-OR gates respectively feed low active Add inputs of add/subtract circuits in the group 305. The add/subtract circuits are uncomplicated up/down counter implementations with low active increment/decrement inputs used as the equivalent of add/subtract inputs. The running totals are incremented and decremented by 1 as indicated by boxes 313.0, 313.1, ... 313.M labelled "1". In this way, logic circuitry of FIG. 24 includes a first set of registers 301.0-.M for holding running totals that are incremented and decremented as a function of polarity of the combined signal input and polarity of at least one signal from the first means (e.g. Se, U or Y). The circuitry is relatively uncomplicated and economical, produces running totals and averages out statistical fluctuations as the running totals are developed with advantageous corresponding effect on the coefficients for the adaptive filter 113.

Figure 25:
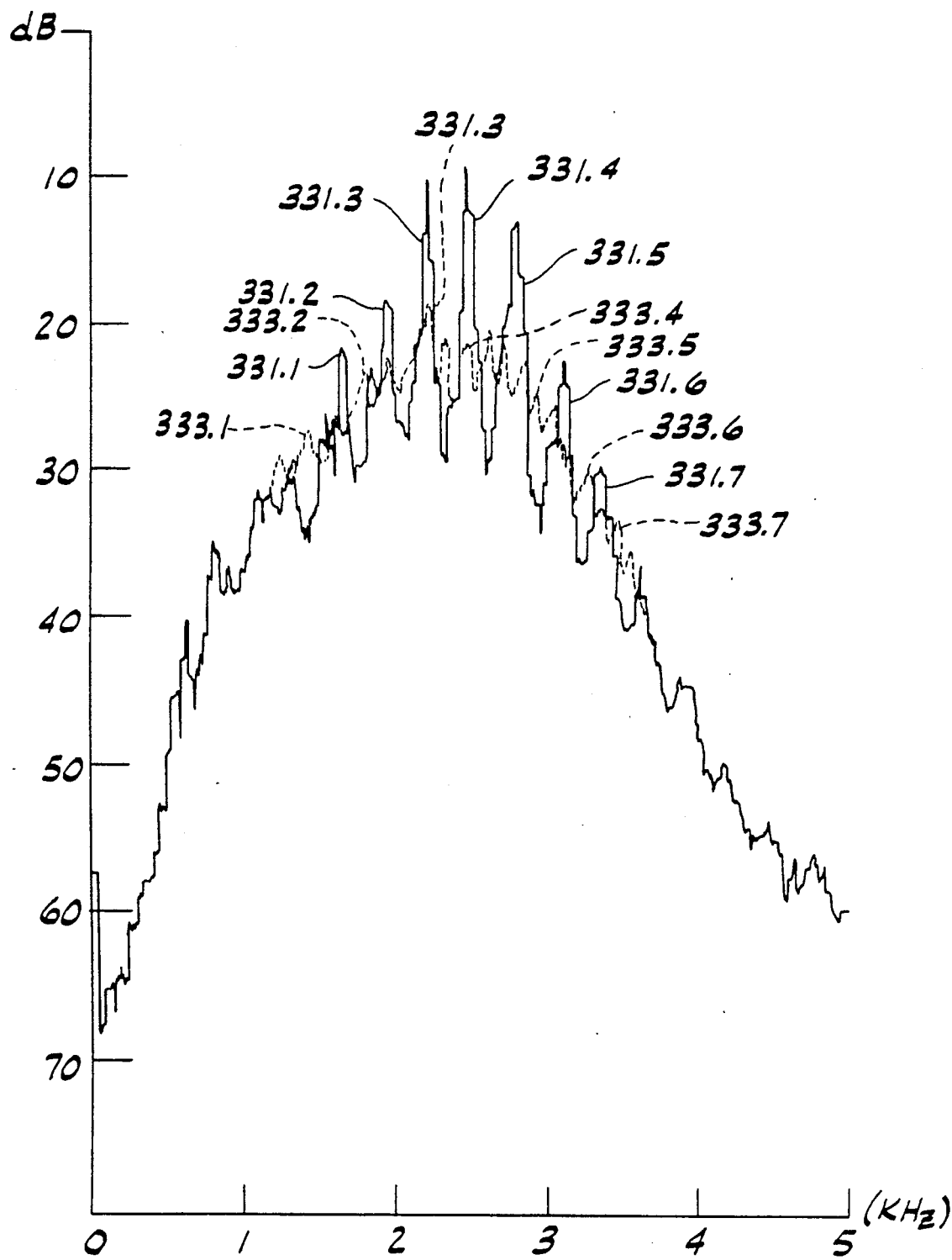
FIG. 25 is a graph of decibels (dB) versus frequency (kiloHertz, kHz.) showing a frequency spectrum (in solid) of the output of a hearing aid without feedback offset compared to a frequency spectrum (in dashed) of the output of a hearing aid with feedback offset according to the invention.

In FIG. 25 a graph of frequency response of a hearing aid circuit in dB (decibels) versus frequency in the range 0-5 kiloHertz is shown. Measured frequency response of the hearing aid circuit with the adaptive filter disconnected and therefore unable to offset the feedback contribution is shown as solid line with numerous sharp, jagged and prominent peaks 331.1, 331.2, 331.3, 331.4, 331.5, 331.6 and 331.7. Without offsetting, the uncorrected frequency spectrum thus exhibits peaks that are indicative of highly underdamped behavior corresponding to incipient instability and "ringing" in the hearing aid circuit. When the volume of the hearing aid is increased beyond a certain point it starts to squeal due to the feedback.

Using inventive apparatus and methods to offset the feedback contribution, the measured frequency response of the hearing aid circuit is as shown in the dashed portions 333.1 through 333.7. It is clear that the peaks when the feedback is offset are reduced and far less prominent and establish a frequency spectrum that is much more even in its response. As a result, volume levels available from circuitry utilizing the inventive apparatus and methods are substantially increased compared to those of circuitry lacking the offsetting capabilities. Stable, equalized system behavior is obtained in acoustic conditions of use that would have caused oscillation without the adaptive equalization in effect. Accordingly, the resulting hearing aid output is substantially easier to listen to and understand by the hearing impaired user.

In the present work it has been discovered that the use of an all-hardware digital adaptive filter is very substantially preferable to microprocessor-based operations. Table 1 shows the characteristics of circuitry which would be involved in the microprocessor estimation approach as compared with the much simpler, less expensive and much more preferable arrangement in the preferred embodiments using the all-hardware digital adaptive filter approach.

As shown by Table 1, the all-hardware arithmetic is relatively simple while the microprocessor arithmetic unit is relatively elaborate. The microprocessor estimation approach inherently involves program address circuitry, memory space for a stored program to do the estimation, and instruction register and decoding hardware, all of which are dispensed with in the all-hardware digital adaptive filter preferred embodiments. Furthermore, input-output logic and control logic in microprocessor circuitry on a VLSI die would be much more elaborate than the relatively simple circuitry which is disclosed herein and is used with the all-hardware digital adaptive filter approach.

TABLE 1

| Microprocessor Estimation | | All-Hardware Digital Adaptive Filter |
|---|---|---|
| Arithmetic Unit | Elaborate | Simpler |
| Program Address Circuitry | Present | None |
| Memory Space for program | Present | None |
| Instruction registers and decoding | Present | None |
| Input/Output logic | Elaborate | Simpler |
| Control logic | Elaborate | Simpler |

In this way and as shown in FIGS. 4, 15, 17, 21, 26 and 27, for example, there is provided first means fabricated on a VLSI die for electronic processing of the electrical output of the microphone to produce a filtered signal and for combining the filtered signal with a second distinct signal for the receiver of the hearing aid. All-hardware digital adaptive filter means is united with, and connected to, the first means on the VLSI die for processing the filtered signal and second distinct signal to produce an adaptive output to the first means to substantially offset the feedback contribution in the electrical output of the microphone in the hearing aid.

The all-hardware digital adaptive filter includes an all-hardware digital filter united with, and connected to, the first means for processing on the VLSI die for processing the filtered signal and second distinct signal in accordance with a series of digital coefficients to produce the adaptive output. Also provided is circuitry for combining the adaptive output with the electrical output and feedback contribution from the microphone to produce a combined signal input to the first means for processing. Further, logic circuit means is united with, and connected to, the first means on the VLSI die for adaptively varying the digital coefficients of the all-hardware digital filter as a function of the combined signal input so that the adaptive output substantially offsets the feedback contribution in the electrical output of the microphone.

Figure 26:
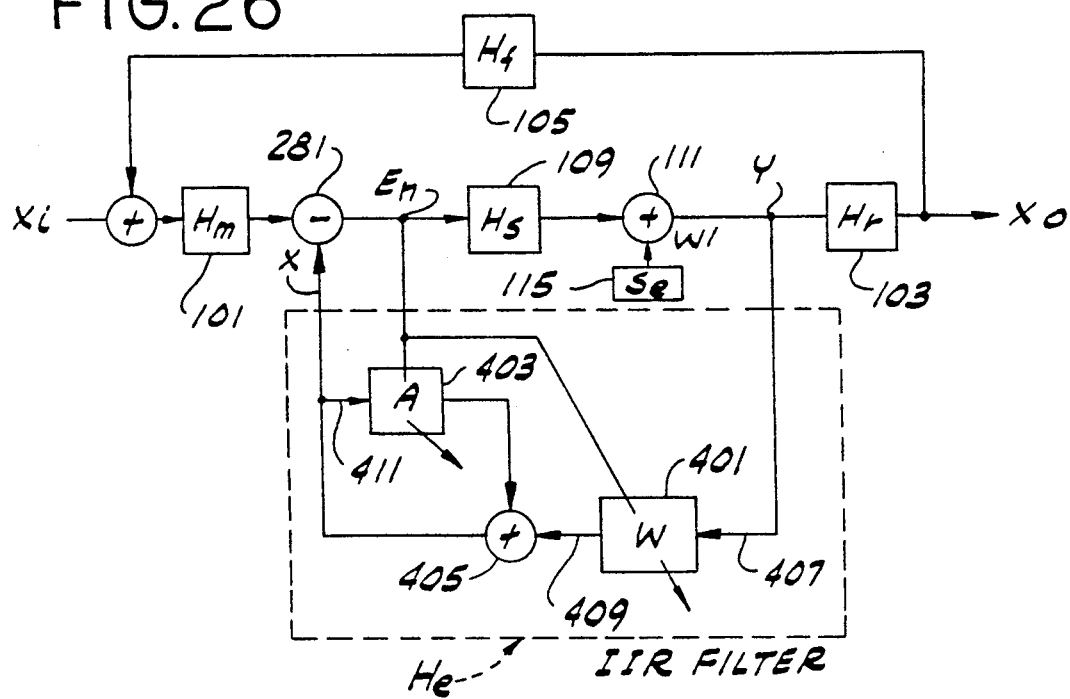
FIG. 26 is a block diagram of another inventive electronic filter for a hearing aid according to the invention improved with an infinite impulse response adaptive filter.

FIG. 26 illustrates a further alternative embodiment of a feedback offsetting circuit. This alternative involves an infinite impulse response (IIR) filter which can increase the range or effectiveness of the offsetting even further with only a modest amount of extra VLSI hardware.

As illustrated in FIG. 26, an FIR adaptive digital filter 401 has its input connected to receive the output Y of combining circuit 111. Filter 401 is shown as a block which includes a logic circuit 285 of FIG. 21 combined with a filter 113 of FIG. 21. The logic circuit in filter 401 is responsive to combined signal input En and output Y. An additional filter block 403 has both its input and output connected to a combining circuit 405. Combining circuit 405 sums the output of filter 403 and the output of filter 401 to produce a sum output X that is fed both to the input of filter 403 and to an input of subtractive combining circuit 281 for offsetting feedback present in the output of microphone block 101.

Filter 403 has the same internal construction as filter 401. In other words filter block 403 has a logic circuit identical to logic circuit 285 of FIG. 21 combined with a filter like 113 of FIG. 21. The logic circuit in filter 403 is responsive to combined signal input En, the same as the logic circuit in filter 401. However, the logic circuit in filter 403 is responsive to output signal X, instead of output signal Y that the logic circuit of filter 401 responds to.

Further, the output of filter 403 is fed back to its own input via combining circuit 405. Filter 401 has no feedback directly back to itself from combining circuit 405 in FIG. 26. Filters 401 and 403 with combining circuit 405 together are an example of an IIR filter; however, sometimes filter 403 and circuit 405 alone are also called an IIR filter as context dictates, for purposes of the present work. Thus, the circuit of FIG. 26 represents an improvement over the circuit of FIG. 21, for instance, by adding an IIR filter in series with the FIR filter of FIG. 21.

The FIR adaptive filter is believed to be well suited to compensate for a component of the feedback path Hf 105 that is comprised of acoustic delay and attenuation. The IIR adaptive filter (403, 405) is believed to be well suited to compensate for resonances that exist in the feedback path. Resonances and very long feedback paths in hearing aids, public address systems and other electroacoustic systems are even further obviated due to the internal feedback and memory, in effect, that the IIR filter approach provides.

Together, filters 401 and 403 with combining circuit 405 are an example of a digital adaptive filter He. This filter He is interconnected with a first circuit (e.g. blocks 281, 109, 111, 115) and responsive to signals supplied from the first circuit. The filter He provides electronic infinite impulse response (IIR) processing of the combination of the filtered signal (e.g. output of Hs 109) and second distinct signal (e.g. Se) 115 so that output X to the first circuit substantially offsets the feedback contribution in the electrical output of the microphone in the hearing aid. The digital adaptive filter He includes a first digital filter 401 and a second digital filter including filter 403 and combining circuit 405. The first digital filter 401 has an input 407 for signal Y, which is one example of a filtered signal combined with a second distinct signal. Filter 401 has an output 409 connected to the combining circuit 405 of second digital filter. The second digital filter produces an output X, part of which is fed back to filter 403 at an input 411 of block 403. Output X of the second digital filter is supplied to the first circuit for electronic processing at subtracting combining circuit 281 to substantially offset the feedback contribution in the electrical output of the microphone means in the hearing aid.

Updating the filter coefficients in filter blocks 401 and 403 is similar to the processes discussed earlier hereinabove, except that two sets of coefficients are involved. Coefficients for filter 401 are designated $w_k$, and coefficients for filter 403 are $a_k$, where k is an index (similar to i hereinabove) for designating each particular coefficient. Recursive expressions for updating the coefficients are:

$$w_k(n+1) = w_k(n) + sgn[En \cdot Y(n-k)] \quad (13)$$

$$a_k(n+1) = a_k(n) + sgn[En \cdot X(n-k)] \quad (14)$$

In the circuit of FIG. 26, filter block 403 has a transfer function A that is adaptively varied. The transfer function represented by the symbol "A" can be a remarkably complicated function in the Laplace (or s or z) domain. Filter block 403 together with combining circuit 405 and feedback thus provided have a transfer function $1/(1-A)$. If the transfer function of FIR filter 401 be represented by W, then the transfer function He of the entire filter assembly 401, 403, 405 of FIG. 26 is $W/(1-A)$.

Figure 27:
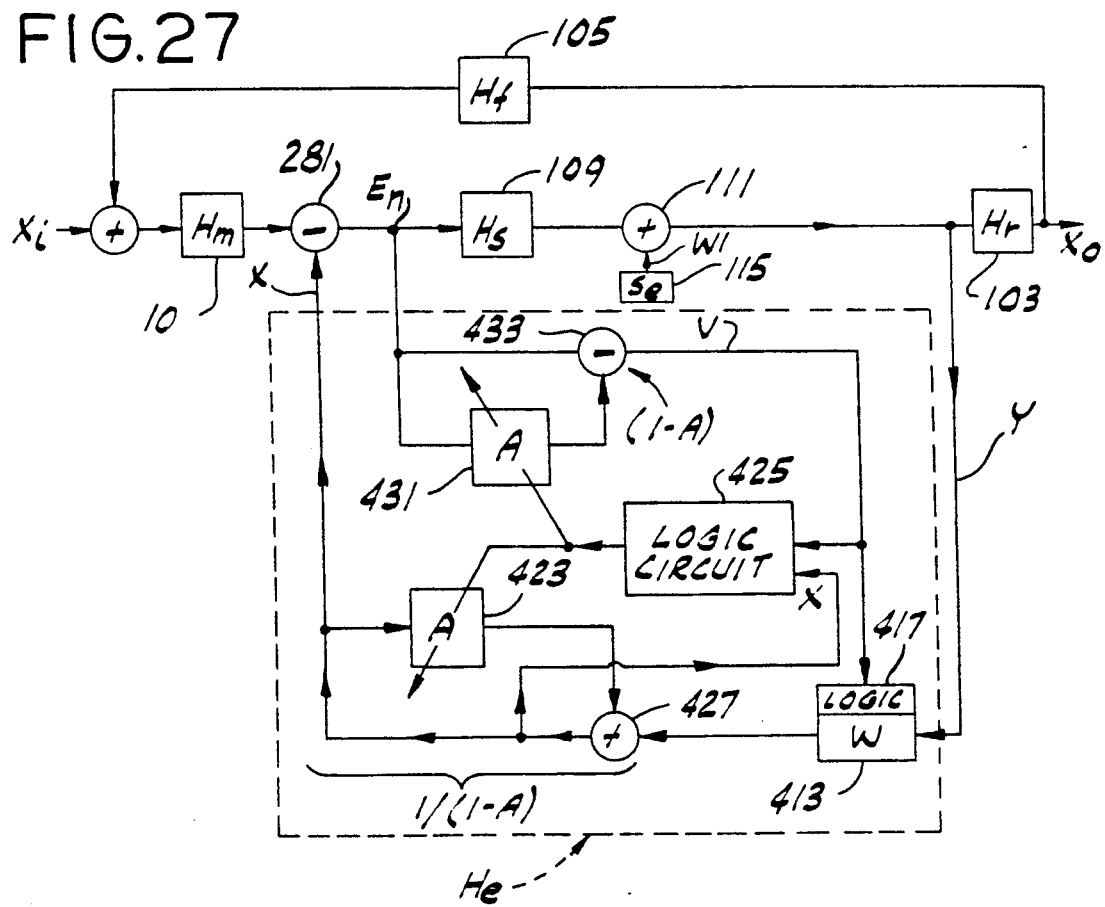
FIG. 27 is a block diagram of yet another inventive electronic filter for a hearing aid according to the invention improved with an infinite impulse response adaptive filter and an error filter.

In FIG. 27 a further improvement adds an error filtering feature. Filter 401 of FIG. 26 is shown as a filter 413 with logic circuit 417 of FIG. 27. Logic circuit 417 is responsive to output Y and to a filtered error signal V to be described presently. A filter 423 and logic circuit 425 of FIG. 27 correspond to filter block 403 of FIG. 26. A combining circuit 427 sums the output of the filters 413 and 423 to provide output X. Output X is also fed back to filter 423.

Logic circuit 425 is shown apart from filter 423 because it advantageously doubles as the logic circuit for an additional error filter 431. Error filter 431 has its input connected to receive the combined signal input En, which is a form of error signal for purposes of feedback filter He. A combining circuit 433 shown as a subtractor is fed with combined signal input En and also with the output of error filter 431. The output V of the circuit having filter 431 and circuit 433 is a filtered error signal of the form $$V = En(1-A) \quad (15)$$

Logic circuit 425 provides identical coefficients to filters 423 and 431. Logic circuit 425 is responsive to outputs V and X and is implemented with any of the circuits of FIGS. 12, 16, 22, 23 and 24 and can use polarity-only or all polarity and magnitude information in combined signal input En. A set of recursive expressions for updating the coefficients of the three filters 413, 423 and 431 of FIG. 27 are $$w_k(n+1) = w_k(n) + sgn[V \cdot Y(n-k)] \quad (16)$$

$$a_k(n+1) = a_k(n) + sgn[V \cdot X(n-k)] \quad (17)$$

There is no need for three equations because the coefficients $a_k$ for both filter 423 and 431 are correspondingly identical.

Note that in each of FIGS. 26 and 27, a dotted box has been drawn around the digital adaptive filter assemblies corresponding to the He box of some earlier block diagrams hereinabove.

The additional error filtering with filter 431 and subtracting circuit 433 of FIG. 27 is believed to provide an even further advantageous feature in smoothing and making even more effective the operation of the adaptive filtering circuitry. A tentative heuristic explanation for the improvement is believed to be that elements 423 and 427 could form a less than fully stable loop (423, 427, 281, 425, 417, 413) due to the $1/(1-A)$ transfer function having a denominator $(1-A)$ approaching zero at some frequency. By adding elements 431 and 433 having a transfer function $(1-A)$ (which is the reciprocal of $1/(1-A)$), a multiplication in effect in the Laplace or frequency domain of $(1-A) \times 1/(1-A)$ occurs so that such denominator effects are cancelled. It is emphasized that this explanation is in no way intended to be limitive or exclusive of other advantageous effects and operations which are also present in this embodiment.

The filter 431 and combining circuit 433 thus provide an example of a third digital filter for filtering a signal (e.g. combined signal input En) that is also supplied to first means for electronic processing. Filter 423 is an example of a digital filter section that has a transfer function and produces an electrical signal which is fed back to itself. Filter 431 with combining circuit 433 provide an example of a means for electronically filtering the combined signal input according to a transfer function which is substantially the reciprocal of the transfer function of the digital filter section, to drive logic circuitry. Logic circuits 425 and 417 together act as a type of logic circuitry fed by the third digital filter for controlling first and second digital filters and thus controlling infinite impulse response (IIR) processing.

Numerous alternative connections to the logic circuits 417 and 425 and use of multiple combining circuits are also available according to the description hereinabove of FIGS. 15, 17 and 21.

A process diagram of FIG. 28 shows illustrative operations of a hearing aid according to some of the inventive methods. Operations commence with a START 501 and proceed to a step 503 to process the electrical output of the microphone 13 into a combined signal input En and to produce a filtered signal according hearing aid amplification and filtering Hs.

In a next step 505, a probe signal such as a pseudorandom noise signal is generated as an example of a second distinct signal that is distinct from the filtered signal just referred to. In a following step 507, the filtered signal is combined with the second distinct signal for the receiver of the hearing aid. The second distinct signal is suitably weighted by a factor W1 so that the magnitude of the second distinct signal thus weighted is generally less than the magnitude of the filtered signal at loudness of normal speech.

If the magnitude of the filtered signal has changed, then a step 509 varies the magnitude of the second distinct signal (e.g. noise) as a function of the magnitude of the filtered signal For instance, in one embodiment it is desirable to vary the magnitude of noise in direct correspondence with the magnitude of the filtered signal so that the magnitudes have an approximately constant ratio.

Succeeding step 511 combines the filtered signal with the noise by weighting the filtered signal by a factor W2 so that the magnitude of the noise is generally greater than the magnitude of the filtered signal at loudness of normal speech.

Next a step 513 derives a series of digital values having polarities responsive to the probe signal, as by shifting pseudorandom noise through a shift register. Then in a step 515 running totals are electronically maintained in a set of registers. Each running total is increased and decreased depending on whether a corresponding value in the series of digital values has the same or opposite polarity compared to the combined signal input.

A test step 517 tests an index N to determine whether it has reached a predetermined value such as 20. If so, the running totals of step 515 are added to update a set of digital filter coefficients, and index N is reset to 1. If index N has not reached 20, operations branch from step 517 to step 521 to increment index N by one, and step 519 is bypassed. In this way, the running totals in the set of registers are respectively added electronically to the coefficients in step 519 less frequently than the increasing and decreasing of step 515 occur.

After either step 519 or 521, operations proceed to a step 523 to adaptively filter the filtered signal and second distinct signal (or probe signal) combined in step 511, for instance. The filtering is accomplished in accordance with digital coefficients varied only in response to polarities, for example, to produce an adaptive output in the hearing aid. An IIR version of the process in this step 523 adaptively filters the filtered signal and second distinct signal to produce an electrical signal and feeds back the electrical signal as shown by arrow 525 so that the electrical signal is adaptively filtered in the same step 523 also, thereby producing the adaptive output.

In a further step 527, the adaptive output is combined with the microphone output, substantially offsetting with the adaptive output the acoustic feedback contribution in the electrical output of the microphone for the processing step 503. Operations loop back to step 503 through a test 529 if the process is to continue. If not, operations branch from test 529 to an END 531.

The invention comprehends numerous embodiments using digital or analog technology and incorporating software, hardware, or firmware as applications dictate. Applications, combinations and processes for hearing aids, public address systems and other electroacoustic systems generally for use in air, underwater, or in other environments are within the scope of the invention.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An electronic filter for a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback contribution to its electrical output, the electronic filter comprising:

first means for electronic processing of the electrical output of the microphone means to produce a filtered signal and for combining the filtered signal with a second distinct signal for the receiver of the hearing aid; and adaptive filter means, interconnected with said first means, for electronic processing of the filtered signal and second distinct signal while said first means is producing the filtered signal to produce an adaptive output to said first means to continuously simultaneously offset the feedback contribution in the electrical output of the microphone means in the hearing aid.

2. An electronic filter as set forth in claim 1 wherein said adaptive filter means includes means for adapting only in response to polarities of signal supplied to and from said first means.

3. An electronic filter as set forth in claim 2 wherein the second distinct signal comprises a noise signal, the electronic filter further comprising means for varying the second distinct signal in magnitude as a function of the magnitude of the filtered signal.

4. An electronic filter as set forth in claim 2 further comprising means for varying the second distinct signal in magnitude as a direct function of an average of the magnitude of the filtered signal.

5. An electronic filter as set forth in claim 1 wherein said first means includes a first combining means for combining the filtered signal with the second distinct signal for the receiver of the hearing aid in a proportion wherein the magnitude of the second distinct signal is generally less than the magnitude of the filtered signal at loudness of normal speech, and the electronic filter further comprises a second combining means for combining the filtered signal with the second distinct signal in a proportion wherein the magnitude of the second distinct signal is generally greater than the magnitude of the filtered signal at loudness of normal speech to produce a second combined signal for said adaptive filter means, said adaptive filter means including means for adapting in response to the second combined signal.

6. An electronic filter as set forth in claim 2 for a hearing aid wherein said adaptive filter means comprises all-hardware digital filter means connected to said first means, for processing the filtered signal and second distinct signal in accordance with a series of digital coefficients to produce the adaptive output;

wherein said first means includes means for combining the adaptive output with the electrical output and feedback contribution from the microphone means to produce a combined signal input to the digital filter means; and wherein the adaptive filter means further comprises logic circuit means for adaptively varying the digital coefficients of the all-hardware digital filter means as a function of polarity of the combined signal input independently of its magnitude so that the adaptive output substantially offsets the feedback contribution in the electrical output of said microphone means.

7. An electronic filter as set forth in claim 6 wherein said first means includes first combining means for combining the filtered signal with the second distinct signal for the receiver of the hearing aid in a proportion wherein the magnitude of the second distinct signal is generally less than the magnitude of the filtered signal at loudness of normal speech, and the electronic filter further comprises a second combining means for combining the filtered signal with the second distinct signal in a proportion wherein the magnitude of the second distinct signal is generally greater than the magnitude of the filtered signal at loudness of normal speech to produce a second combined signal for said adaptive filter means, said logic means including means for adaptively varying the digital coefficients of the all-hardware digital filter means as a function of polarity of the second combined signal independently of its magnitude so that the adaptive output substantially offsets the feedback contribution in the electrical output of said microphone means.

8. An electronic filter as set forth in claim 6 wherein said first means includes all-hardware digital filter-limit-filter means for processing the combined signal input in accordance with a second series of digital coefficients to produce the filtered signal, and serial interface means for providing the second series of digital coefficients from an external source.

9. An electronic filter as set forth in claim 6 wherein the combined signal input is a digital signal that has a magnitude and includes a polarity signal representing a changing polarity of the combined signal input and said logic circuit means includes means for temporarily storing a series of values, said temporarily storing means connected to said first means so that the series of values represent samples of polarity of the filtered signal combined with the second distinct signal, and means for increasing and decreasing each coefficient in magnitude for said all-hardware digital filter means by an amount independent of the magnitude of the combined signal input, the increasing and decreasing of each coefficient respectively depending on whether a corresponding value in said series of values has the same or opposite polarity compared to the polarity currently represented by the polarity signal.

10. An electronic filter as set forth in claim 6 wherein the combined signal input is a digital signal that has a magnitude and includes a polarity signal representing a changing polarity of the combined signal input, and said logic circuit means includes means for temporarily storing a series of values, said temporarily storing means connected to said first means so that the series of values represent samples of polarity of the second distinct signal, and means for increasing and decreasing each coefficient in magnitude for said all-hardware digital filter means by an amount independent of the magnitude of the combined signal input, the increasing and decreasing of each coefficient respectively depending on whether a corresponding value in the series of values has the same or opposite polarity compared to the polarity currently represented by the polarity signal.

11. An electronic filter as set forth in claim 6 wherein said first means includes an all-hardware digital filter.

12. An electronic filter as set forth in claim 6 wherein said first means includes a filter-limit-filter digital filter.

13. An electronic filter as set forth in claim 6 wherein said first means includes a four-channel filter-limit-filter digital filter.

14. An electronic filter as set forth in claim 6 wherein said logic circuit means includes a first set of registers for holding running totals that are incremented and decremented as a function of polarity of the combined signal input and polarity of at least one signal from said first means, and said logic circuit means also includes a second set of registers holding digital values representing each coefficient, and means for respectively adding the running totals in the first-named set of registers to corresponding digital values in the second set of registers.

15. An electronic filter as set forth in claim 14 wherein said means for adding includes means for respectively adding the running totals in the first set of registers to the corresponding digital values in the second set of registers less frequently than the incrementing and decrementing of the first set of registers occurs.

16. An electronic filter as set forth in claim 14 further comprising means for supplying clock pulses to initiate the incrementing and decrementing of the first set of registers, and means for frequency dividing the clock pulses to supply a second set of clock pulses to the second set of registers to update them at a frequency divided rate from said means for adding.

17. An electronic filter as set forth in claim 1 wherein said first means comprises first all-hardware filter means for electronic processing of the electrical output of said microphone means in accordance with a first series of coefficients to produce a filtered signal and for combining the filtered signal with a second distinct signal for the receiver;

wherein said adaptive filter means comprises second all-hardware filter means united with and connected to said first all-hardware filter means as one VLSI circuit, for electronic processing of the filtered signal and second distinct signal in accordance with a second series of coefficients to produce an adaptive output; and wherein said first means includes means for combining the adaptive output with the electrical output from the microphone means to produce a combined signal input to said first all-hardware filter means; and wherein said adaptive filter means comprises all-hardware logic circuit means united with and connected to said first all-hardware filter means for adaptively varying, while the first filter means is producing the filtered signal, the coefficients of the second all-hardware filter means as a function of the combined signal input so that the adaptive output continuously simultaneously offsets the feedback contribution in the electrical output of said microphone means.

18. A hearing aid as set forth in claim 17 wherein the combined signal input is a digital signal that has a magnitude and includes a polarity signal representing a changing polarity of the combined signal input and said all-hardware logic circuit means includes means for temporarily storing a series of values, said means for temporarily storing connected to said first all-hardware filter means so that the series of values represent polarities of recent samples of the filtered signal combined with the second distinct signal, and means for increasing or decreasing each coefficient in magnitude in the second series of coefficients for said second all-hardware filter means by an amount independent of the magnitude of the combined signal input, the increasing and decreasing of each coefficient respectively depending on whether a corresponding value in said series of values has the same or opposite polarity compared to the polarity currently represented by the polarity signal.

19. A hearing aid as set forth in claim 17 wherein the combined signal input is a digital signal that has a magnitude and includes a polarity signal representing a changing polarity of the combined signal input and said all-hardware logic circuit means includes means for temporarily storing a series of values, said means for temporarily storing connected to said first all-hardware filter means so that the series of values represent polarities of recent samples of the filtered signal combined with the second distinct signal, and means for increasing or decreasing each coefficient in magnitude in the second series of coefficients for said second all-hardware filter means by a predetermined amount independent of both the magnitude of the combined signal input and the magnitude of the filtered signal combined with the second distinct signal, the increasing and decreasing of each coefficient respectively depending on whether a corresponding value in said series of values has the same or opposite polarity compared to the polarity currently represented by the polarity signal.

20. A hearing aid as set forth in claim 17 wherein the second distinct signal comprises a pseudorandom noise signal, the combined signal input has a changing polarity signal, and said all-hardware logic circuit means includes:
   means for temporarily storing a series of values, said means for temporarily storing connected to said first all-hardware filter means so that the series of values represent polarities of recent samples of the pseudorandom noise signal; and
   means for increasing or decreasing each coefficient in magnitude in the second series of coefficients for said second all-hardware filter means by a predetermined amount independent of both the magnitude of the combined signal input and the magnitude of the filtered signal combined with the second distinct signal, the increasing and decreasing of each coefficient in the second series respectively depending on whether a corresponding value in said series of values has the same or opposite polarity compared to the polarity currently represented by the polarity signal, the adaptive output thereby substantially offsetting the feedback contribution in the electrical output of said microphone means.

21. A hearing aid as set forth in claim 17 further comprising serial interface means for providing from an external source the first series of coefficients to said first all-hardware filter means.

22. An electronic filter as set forth in claim 1 wherein said first means comprises means for amplifying the electrical output of the microphone means to produce an amplified signal and for combining the amplified signal with a pseudorandom noise signal to produce a combined amplified signal for the receiver; and wherein said adaptive filter means comprises all-hardware filter means for electronic processing of the combined amplified signal in accordance with a series of coefficients to produce an adaptive output;
   wherein said first means includes means for combining the adaptive output with the electrical output from the microphone means as a combined signal input to the adaptive filter means, the combined signal input having a polarity that changes with time;
   and wherein said adaptive filter means includes means for temporarily storing a series of values representing recent polarities of the pseudorandom noise signal; and
   means for varying each coefficient in magnitude in the series of coefficients by increasing or decreasing each coefficient as a function of the combined signal input, the increasing or decreasing of each coefficient depending on whether a value corresponding thereto in the series of values is the same as or opposite from the currently-occurring polarity of the combined signal input, the adaptive output thereby substantially offsetting the feedback contribution in the electrical output of said microphone means.

23. An electronic filter as set forth in claim 22 wherein said means for varying each coefficient includes a first set of registers for running totals, means responsive to the temporarily stored series of values representing polarities of the pseudorandom noise signal for increasing or decreasing each running total in magnitude by an amount directly related to the magnitude of the combined signal input, the increasing or decreasing of each running total depending on whether a value corresponding thereto in the series of values is the same as or opposite from the currently-occurring polarity of the combined signal input, said means for varying further including a second set of registers holding digital values representing each coefficient, and means for respectively adding the running totals in the first set of registers to the corresponding digital values in the second set of registers less frequently than the increasing and decreasing in the first set of registers occurs.

24. An electronic filter as set forth in claim 23 further comprising means for supplying clock pulses to initiate the increasing and decreasing in the first set of registers, and means for frequency dividing the clock pulses to supply a second set of clock pulses to the second set of registers to update them at a frequency divided rate from said means for adding.

25. An electronic filter as set forth in claim 1 wherein said adaptive filter means comprises:
   means, interconnected with said first means and responsive to signals supplied to and from said first means, for electronic infinite impulse response processing of the filtered signal and second distinct signal to produce an adaptive output to said first means to substantially offset the feedback contribution in the electrical output of the microphone means in the hearing aid.

26. An electronic filter as set forth in claim 25 wherein said adaptive filter means includes first digital filter means and second digital filter means, said first digital filter means having an input for the filtered signal combined with the second distinct signal and having an output connected to said second digital filter means, said second digital filter means producing an output, part of which is fed back to itself, the output of said second digital filter means being supplied to said first means for electronic processing to substantially offset the feedback contribution in the electrical output of the microphone means in the hearing aid.

27. An electronic filter as set forth in claim 26 wherein said adaptive filter means further includes third digital filter means for filtering a signal that is also supplied to said first means for electronic processing, and logic circuit means fed by said third digital filter means for controlling said first and second digital filter means.

28. An electronic filter as set forth in claim 25 wherein said adaptive filter means includes means for electronically filtering a signal that is also supplied to said first means for electronic processing, and logic circuit means, fed by said means for electronically filtering, for controlling the infinite impulse response (IIR) processing.

29. An electronic filter as set forth in claim 25 wherein said adaptive filter means comprises all-hardware digital filter means connected to said first means, for processing the filtered signal and second distinct signal in accordance with a series of digital coefficients to produce the adaptive output;
wherein said first means includes means for combining the adaptive output with the electrical output and feedback contribution from the microphone means to produce a combined signal input to the first means; and
wherein the adaptive filter means further comprises logic circuit means for adaptively varying the digital coefficients of the all-hardware digital filter means as a function of the combined signal input so that the adaptive output substantially offsets the feedback contribution in the electrical output of said microphone means.

30. An electronic filter as set forth in claim 29 wherein said adaptive filter means further includes means for electronically filtering the combined signal input for said logic circuit means to control the infinite impulse response (IIR) processing.

31. An electronic filter for a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback contribution to its electrical output, the electronic filter comprising:
first means for electronically processing the electrical output of the microphone means to produce a filtered signal and for combining the filtered signal with a second distinct signal for the receiver of the hearing aid;
means for varying the second distinct signal in magnitude as a function of the magnitude of the filtered signal; and adaptive means, interconnected with said first means, for processing the filtered signal and second distinct signal to produce an adaptive output to said first means to substantially offset the feedback contribution in the electrical output of the microphone means in the hearing aid.

32. An electronic filter as set forth in claim 31 wherein said means for varying includes means for changing the second distinct signal in magnitude as a direct function of an average of the magnitude of the filtered signal.

33. An electronic filter as set forth in claim 31 wherein said first means includes a first combining means for combining the filtered signal with the second distinct signal for processing by said adaptive means in a proportion wherein the magnitude of the second distinct signal is generally less than the magnitude of the filtered signal at loudness of normal speech, and the electronic filter further comprises a second combining means for combining the filtered signal with the second distinct signal in a proportion wherein the magnitude of the second distinct signal is generally greater than the magnitude of the filtered signal at loudness of normal speech to produce a second combined signal for said adaptive means, said adaptive means including means for modifying its processing in response to the second combined signal.

34. An electronic filter as set forth in claim 31 for a hearing aid wherein said adaptive means includes all-hardware digital filter means connected to said first means, for processing the filtered signal and second distinct signal in accordance with a series of digital coefficients to produce the adaptive output;
wherein said first means includes means for combining the adaptive output with the electrical output and feedback contribution from the microphone means to produce a combined signal input to said digital filter means; and
wherein the adaptive filter means further comprises logic circuit means for adaptively varying the digital coefficients of the all-hardware digital filter means as a function of the combined signal input so that the adaptive output substantially offsets the feedback contribution in the electrical output of said microphone means.

35. An electronic filter as set forth in claim 34 wherein said first means includes all-hardware digital filter-limit-filter means for processing the combined signal input in accordance with a second series of digital coefficients to produce the filtered signal, and serial interface means for providing the second series of digital coefficients from an external source.

36. An electronic filter as set forth in claim 34 wherein said logic circuit means includes a first set of registers for holding running totals that are incremented and decremented as a function of polarity of the combined signal input and polarity of at least one signal from said first means, and said logic circuit means also includes a second set of registers holding digital values representing each coefficient, and means for respectively adding the running totals in the first-named set of registers to corresponding digital values in the second set of registers.

37. An electronic filter as set forth in claim 36 wherein said means for adding includes means for respectively adding the running totals in the first set of registers to the corresponding digital values in the second set of registers less frequently than the incrementing and decrementing of the first set of registers occurs.

38. An electronic filter as set forth in claim 36 further comprising means for supplying clock pulses to initiate the incrementing and decrementing of the first set of registers, and means for frequency dividing the clock pulses to supply a second set of clock pulses to the second set of registers to update them at a frequency divided rate from said means for adding.

39. An electronic filter for a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback to its electrical output which feedback is to be substantially offset, the electronic filter comprising:

means for electronic processing of the electrical output of the microphone means to produce a filtered signal;

first combining means for combining the filtered signal with a second distinct signal for the receiver of the hearing aid in a proportion wherein the magnitude of the second distinct signal is generally less than the magnitude of the filtered signal at loudness of normal speech; and second combining means for combining the filtered signal with the second distinct signal to produce a control signal for affecting the processing by said means for electronic processing wherein the magnitude of the second distinct signal is generally greater than the magnitude of the filtered signal at loudness of normal speech.

40. An electronic filter as set forth in claim 39 wherein said means for electronic processing includes a digital filter having the filtered signal as its output and wherein said electronic filter further includes digital adaptive filter means for electronic processing of the filtered signal and second distinct signal to produce an adaptive output to said digital filter to substantially offset the feedback contribution in the electrical output of the microphone means in the hearing aid.

41. An electronic filter as set forth in claim 40 wherein said digital filter comprises a filter-limit-filter digital filter.

42. An electronic filter as set forth in claim 40 wherein said digital adaptive filter means includes all-hardware digital filter means for processing the filtered signal and second distinct signal from said first combining means in accordance with a series of digital coefficients to produce the adaptive output, and logic circuit means responsive to the control signal for electronically adjusting the series of digital coefficients of the all-hardware digital filter means so that the adaptive output substantially offsets the feedback contribution in the electrical output of said microphone means.

43. An electronic filter as set forth in claim 42 wherein said logic circuit means includes a first set of registers for running totals incremented and decremented as a function of the control signal, and a second set of registers holding digital values representing each coefficient, and means for respectively adding the running totals in the first set of registers to corresponding digital values in the second set of registers.

44. An electronic filter as set forth in claim 43 wherein said means for respectively adding the running totals in the first set of registers to the corresponding digital values in the second set of registers includes means for updating the second set of registers less frequently than the incrementing and decrementing of the first set of registers occurs.

45. An electronic filter for a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback to its electrical output which feedback is to be substantially offset, the electronic filter comprising:

means for generating a probe signal for the receiver of the hearing aid so that a sound corresponding to the probe signal is included in the sound emitted by the receiver;

filter means for electronic processing of the probe signal in accordance with a series of coefficients to produce a filter output;

means for combining the filter output with the electrical output from the microphone means, some of the sound corresponding to the probe signal returning to the microphone means, to produce a combined signal input having a changing polarity for the hearing aid;

means for electronically deriving a series of values having polarities responsive to the probe signal;

first storage means for holding running totals and second storage means for holding the series of coefficients;

means for increasing and decreasing each running total in said first storage means depending on whether a corresponding value in the series of values has the same or opposite polarity compared to the combined signal input; and means for respectively adding the running totals in said first storage means to the coefficients in said second storage means to update the coefficients for said filter means less frequently than the increasing and decreasing of the running totals in said first storage means occurs.

46. An electronic filter as set forth in claim 45 wherein said first storage means includes a first set of registers and said second storage means includes a second set of registers, the electronic filter further comprising means for supplying clock pulses to initiate increasing and decreasing of the first set of registers, and means for frequency dividing the clock pulses to supply a second set of clock pulses to the second set of registers to update them at a frequency divided rate from said means for adding.

47. An electronic filter for a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback contribution to its electrical output, the electronic filter comprising:

a VLSI die;

first means fabricated on said VLSI die for electronic processing of the electric output of the microphone means to produce a filtered signal and for combining the filtered signal with a second distinct signal for the receiver of the hearing aid; and all-hardware adaptive filter means united with and connected to said first means on said VLSI die for processing the filtered signal and second distinct signal while said first means is producing the filtered signal to produce an adaptive output to said first means to substantially offset the feedback contribution in the electrical output of the microphone means in the hearing aid.

48. An electronic filter as set forth in claim 47 for a hearing aid wherein said all-hardware adaptive filter means comprises all-hardware digital filter means united with and connected to said first means on said VLSI die for processing the filtered signal and second distinct signal in accordance with a series of digital coefficients to produce the adaptive output;

wherein said first means includes means for combining the adaptive output with the electrical ;output and feedback contribution from the microphone means to produce a combined signal input to the digital filter means; and wherein the adaptive filter means further comprises logic circuit means on said VLSI die for adaptively varying the digital coefficients of the all-hardware digital filter means as a function of the combined signal input so that the adaptive output substantially offsets the feedback contribution in the electrical output of said microphone means.

49. An electronic filter as set forth in claim 48 wherein said first means includes a first combining means for combining the filtered signal with the second distinct signal for the receiver of the hearing aid in a proportion wherein the magnitude of the second distinct signal is generally less than the magnitude of the filtered signal at loudness of normal speech, and the electronic filter further comprises a second combining means for combining the filtered signal with the second distinct signal to produce a second combined signal for said adaptive filter means wherein the magnitude of the second distinct signal is generally greater than the magnitude of the filtered signal at loudness of normal speech, said logic means including means for adaptively varying the digital coefficients of the all-hardware digital filter means as a function of the second combined signal so that the adaptive output substantially offsets the feedback contribution in the electrical output of said microphone means.

50. An electronic filter as set forth in claim 48 wherein said first means includes all-hardware digital filter-limit-filter means for processing the combined signal input in accordance with a second series of digital coefficients to produce the filtered signal, and the electronic filter further comprises serial interface means for providing the second series of digital coefficients.

51. An electronic filter as set forth in claim 48 wherein the combined signal input is a digital signal that has a magnitude and includes a polarity signal representing a changing polarity of the combined signal input and said logic circuit means includes means for temporarily storing a series of values, said means for temporarily storing connected to said first means so that the series of values represent samples of polarity of the filtered signal combined with the second distinct signal, and means for increasing and decreasing each coefficient in magnitude for said all-hardware digital filter means by a function of the combined signal input, the increasing and decreasing of each coefficient respectively depending on whether a corresponding value in said series of values has the same or opposite polarity compared to the polarity currently represented by the polarity signal.

52. An electronic filter as set forth in claim 48 wherein the combined signal input is a digital signal that has a magnitude and includes a polarity signal representing a changing polarity of the combined signal input and said logic circuit means includes means for temporarily storing a series of values, said means for temporarily storing connected to said first means so that the series of values represent samples of polarity of the second distinct signal, and means for increasing and decreasing each coefficient in magnitude for said all-hardware digital filter means by a function of the combined signal input, the increasing and decreasing of each coefficient respectively depending on whether a corresponding value in the series of values has the same or opposite polarity compared to the polarity currently represented by the polarity signal.

53. An electronic filter as set forth in claim 47 wherein said first means includes an all-hardware digital filter.

54. An electronic filter as set forth in claim 47 wherein said first means includes a filter-limit-filter digital filter.

55. An electronic filter as set forth in claim 47 wherein said first means includes a four-channel filter-limit-filter digital filter.

56. A hearing aid adapted to be coupled to a user, comprising:

a microphone means for generating an electrical output from sounds external to said user; an electrically driven receiver means for emitting sound into the ear of said user, some of the sound emitted by said receiver returning to said microphone means to add a feedback contribution to its electrical output;

means for electronically processing the electrical output of the microphone means to produce a filtered signal for the receiver means; and an adaptive filter means, having an input coupled to said filtered signal, for processing said filtered signal while said means for electronically processing is producing the filtered signal to continuously simultaneously offset said feedback contribution in the electrical output of said microphone means.

57. A hearing aid as set forth in claim 56 wherein said adaptive filter comprises:

digital adaptive filter means interconnected with said electronic processor, for processing the filtered signal and second distinct signal while the first means is producing the filtered signal to produce an electrical signal which is fed back into the digital adaptive filter means, thereby producing an adaptive output for said electronic processor for electronic processing to continuously simultaneously offset the feedback contribution in the electrical output of the microphone means in the hearing aid.

58. An electronic filter as set forth in claim 57 wherein said digital adaptive filter means comprises all-hardware digital filter means connected to said electronic processor, for processing the filtered signal and second distinct signal in accordance with a series of digital coefficients to produce the adaptive output;

wherein said first means includes means for combining the adaptive output with the electrical output and feedback contribution from the microphone means to produce a combined signal input to said digital adaptive filter means; and wherein said adaptive filter means further comprises logic circuit means for adaptively varying the digital coefficients of the all-hardware digital filter means as a function of the combined signal input so that the adaptive output continuously simultaneously offsets the feedback contribution in the electrical output of said microphone means.

59. An electronic filter as set forth in claim 58 wherein said digital adaptive filter means further includes means for electronically filtering the combined signal input to drive said logic circuit means.

60. An electronic filter as set forth in claim 58 wherein said digital adaptive filter means further includes a digital filter section that produces the electrical signal which is fed back into the digital filter section, said digital filter section having a transfer function, and means for electronically filtering the combined signal input according to a transfer function which is substantially the reciprocal of the transfer function of said digital filter section, to drive said logic circuit means.

61. A hearing aid comprising:

microphone means for generating an electrical output from sounds external to a user of the hearing aid;

electrically driven receiver means for emitting sound into the ear of the user of the hearing aid, some of the sound emitted by the receiver returning to said microphone means to add a feedback contribution to its electrical output;

first means for electronically processing the electrical output of the microphone means to produce a filtered signal and for combining the filtered signal with a second distinct signal for the receiver of the hearing aid;

means for varying the second distinct signal in magnitude as a function of the magnitude of the filtered signal; and adaptive means, interconnected with said first means, for processing the filtered signal and second distinct signal to produce an adaptive output to said first means to substantially offset the feedback contribution in the electrical output of the microphone means in the hearing aid.

62. A hearing aid comprising:

microphone means for generating an electrical output from sounds external to a user of the hearing aid;

electrically driven receiver means for emitting sound into the ear of the user of the hearing aid, some of the sound emitted by the receiver returning to said microphone means to add a feedback to its electrical output, which feedback is to be substantially offset;

means for electronic processing of the electrical output of the microphone means to produce a filtered signal;

first combining means for combining the filtered signal with a second distinct signal for the receiver of the hearing aid in a proportion wherein the magnitude of the second distinct signal is generally less than the magnitude of the filtered signal at loudness of normal speech; and second combining means for combining the filtered signal with the second distinct signal to produce a control signal for said means for electronic processing wherein the magnitude of the second distinct signal is generally greater than the magnitude of the filtered signal at loudness of normal speech.

63. A hearing aid comprising:

microphone means for generating an electrical output from sounds external to a user of the hearing aid;

electrically driven receiver means for emitting sound into the ear of the user of the hearing aid, some of the sound emitted by the receiver returning to said microphone means to add a feedback to its electrical output which feedback is to be substantially offset;

means for generating a probe signal for the receiver of the hearing aid so that a sound corresponding to the probe signal is included in the sound emitted by the receiver;

digital filter means for electronic processing of the probe signal in accordance with a series of digital coefficients to produce a filter output;

means for combining the filter output with the electrical output from the microphone means, some of the sound corresponding to the probe signal returning to the microphone means, to produce a combined signal input having a changing polarity for the hearing aid;

means for electronically deriving a series of digital values having polarities responsive to the probe signal;

a first set of registers for holding running totals and a second set of registers for holding the series of digital coefficients;

means for increasing and decreasing each running total in said first set of registers depending on whether a corresponding value in the series of digital values has the same or opposite polarity compared to the combined signal input; and means for respectively adding the running totals in the first set of registers to the coefficients in the second set of registers to update the coefficients for said digital filter means less frequently than the increasing and decreasing of the first set of registers occurs.

64. A hearing aid comprising:

microphone means for generating an electrical output from sounds external to a user of the hearing aid;

electrically driven receiver means for emitting sound into the ear of the user of the hearing aid, some of the sound emitted by the receiver returning to said microphone means to add a feedback contribution to its electrical output;

a VLSI die;

first means fabricated on said VLSI die for electronic processing of the electrical output of the microphone means to produce a filtered signal and for combining the filtered signal with a second distinct signal for the receiver of the hearing aid; and all-hardware digital adaptive filter means united with and connected to said first means on said VLSI die for processing the filtered signal and second distinct signal while the first means is producing the filtered signal to produce an adaptive output to said first means to substantially offset the feedback contribution in the electrical output of the microphone means in the hearing aid.

65. A method of operating a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback contribution to its electrical output, the method comprising the steps of:

processing the electrical output of the microphone means to produce a filtered signal;

combining the filtered signal with a second distinct signal for the receiver of the hearing aid;

adaptively filtering the filtered signal and second distinct signal with coefficients varied only in response to polarities, to produce an adaptive output in the hearing aid; and continuously simultaneously offsetting with the adaptive output the feedback contribution in the electrical output of the microphone means for the processing step.

66. A method of operating a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback contribution to its electrical output, the method comprising the steps of:
- processing the electrical output of the microphone means to produce a filtered signal;
- generating a second distinct signal and varying it in magnitude as a function of the magnitude of the filtered signal;
- combining the filtered signal with a second distinct signal for the receiver of the hearing aid;
- adaptively filtering the filtered signal and second distinct signal to produce an adaptive output in the hearing aid; and
- substantially offsetting with the adaptive output the feedback contribution in the electrical output of the microphone means for the processing step.

67. A method of operating a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback to its electrical output which feedback is to be substantially offset, the method comprising the steps of:
- processing the electrical output of the microphone means to produce a filtered signal;
- combining the filtered signal with a second distinct signal for the receiver of the hearing aid in a proportion wherein the magnitude of the second distinct signal is generally less than the magnitude of the filtered signal at loudness of normal speech; and
- combining the filtered signal with the second distinct signal to produce a control signal for said processing step wherein the magnitude of the second distinct signal is generally greater than the magnitude of the filtered signal at loudness of normal speech.

68. A method of operating a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback contribution to its electrical output, the method comprising the steps of:
- generating a probe signal for the receiver of the hearing aid so that a sound corresponding to the probe signal is included in the sound emitted by the receiver;
- filtering the probe signal in accordance with a series of coefficients to produce a filtered output;
- combining the filtered output with the electrical output from the microphone means, some of the sound corresponding to the probe signal returning to the microphone means, to produce a combined signal input having a changing polarity for the hearing aid;
- electronically deriving a series of values having polarities responsive to the probe signal;
- electronically maintaining running totals in a set of registers and increasing and decreasing each running total depending on whether a corresponding value in the series of values has the same or opposite polarity compared to the combined signal input; and
- respectively adding electronically the running totals in the set of registers to the coefficients less frequently than the increasing and decreasing occur.

69. A method of operating a hearing aid having microphone means for generating an electrical output from sounds external to a user of the hearing aid and electrically driven receiver means for emitting sound into the ear of the user of the hearing aid, some of the sound emitted by the receiver returning to the microphone means to add a feedback contribution to its electrical output, the method comprising the steps of:
- processing the electrical output of the microphone means to produce a filtered signal;
- combining the filtered signal with a second distinct signal for the receiver of the hearing aid;
- adaptively filtering during the processing step the filtered signal and second distinct signal to produce an adaptive output;
- feeding back the adaptive output to continuously simultaneously offset the feedback contribution in the electrical output of the microphone means for the processing step.

70. An electronic filter for an electroacoustic system having microphone means for generating an electrical output from external sounds and electrically driven transducer means for emitting sound, some of the sound emitted by the transducer returning to the microphone means to add a feedback contribution to its electrical output, the electronic filter comprising:
- first means for electronically processing the electrical output of the microphone means to produce a filtered signal and for combining the filtered signal with a second distinct signal for the transducer;
- means for varying the second distinct signal in magnitude as a function of the magnitude of the filtered signal; and
- adaptive means, interconnected with said first means, for processing the filtered signal and second distinct signal to produce an adaptive output to said first means to substantially offset the feedback contribution in the electrical output of the microphone means.

71. An electronic filter for an electroacoustic system having microphone means for generating an electrical output from external sounds and electrically driven transducer means for emitting sound, some of the sound emitted by the transducer returning to the microphone means to add a feedback contribution to its electrical output, the electronic filter comprising:
- means for generating a probe signal for the transducer so that a sound corresponding to the probe signal is included in the sound emitted by the transducer;
- filter means for electronic processing of the probe signal in accordance with a series of coefficients to produce a filter output;
- means for combining the filter output with the electrical output from the microphone means, some of the sound corresponding to the probe signal returning to the microphone means, to produce a combined signal input having a changing polarity;
- means for electronically deriving a series of values having polarities responsive to the probe signal;
- first storage means for holding running totals and second storage means for holding the series of coefficients;
- means for increasing and decreasing each running total in said first storage means depending on whether a corresponding value in the series of values has the same or opposite polarity compared to the combined signal input; and means for respectively adding the running totals in said first storage means to the coefficients in said second storage means to update the coefficients for said filter means less frequently than the increasing and decreasing of the running totals in said first storage means occurs.

72. An electronic filter for an electroacoustic system having microphone means for generating an electrical output from external sounds and electrically driven transducer means for emitting sound, some of the sound emitted by the transducer returning to the microphone means to add a feedback contribution to its electrical output, the electronic filter comprising:
first means fabricated on said VLSI die for electronic processing of the electrical output of the microphone means to produce a filtered signal; and
all-hardware adaptive filter means united with and connected to said first means on said VLSI die for processing the filtered signal while the first means is producing the filtered signal to produce an adaptive output to said first means to substantially offset the feedback contribution in the electrical output of the microphone means.

73. An electroacoustic system comprising:
a microphone means for generating an electrical output from external sounds;
an electrically driven transducer means for emitting sound, some of the sound emitted by the transducer returning to said microphone to add a feedback contribution to its electrical output;
a first filter means for electronically processing said electrical output of said microphone means to produce a filtered signal and combining the filtered signal with a second distinct signal for said transducer means;
a second filter means, united with and connected to said first filter means electronically processing said filtered signal and said second distinct signal to produce an adaptive output;
combining means for combining said adaptive output with said electrical output from said microphone means to produce a combined signal input to said first filter means; and
circuit means united with and connected to said first filter means for adaptively varying, while the first filter means is producing the filtered signal, the processing of the second filter means as a function of said combined signal input so that the adaptive output continuously simultaneously offsets the feedback contribution in the electrical output of said microphone means.

74. An electronic filter for an electroacoustic system having microphone means for generating an electrical output from external sounds and electrically driven transducer means for emitting sound, some of the sound emitted by the transducer returning to the microphone means to add a feedback contribution to its electrical output, the electronic filter comprising:
means for amplifying the electrical output of the microphone means to produce an amplified signal and for combining the amplified signal with a pseudorandom noise signal to produce a combined amplified signal for the transducer;
all-hardware filter means for electronic processing of the combined amplified signal in accordance with a series of coefficients to produce an adaptive output;
means for combining the adaptive output with the electrical output from the microphone means as a combined signal input to the means for amplifying, the combined signal input having a polarity that changes with time;
means for temporarily storing a series of values representing recent polarities of the pseudorandom noise signal; and
means for varying each coefficient in magnitude in the series of coefficients by increasing or decreasing each coefficient as a function of the combined signal input, the increasing or decreasing of each coefficient depending on whether a value corresponding thereto in the series of values is the same as or opposite from the currently-occurring polarity of the combined signal input, the adaptive output thereby substantially offsetting the feedback contribution in the electrical output of said microphone means.

75. An electronic filter for an electroacoustic system having microphone means for generating an electrical output from external sounds and electrically driven transducer means for emitting sound, some of the sound emitted by the transducer returning to the microphone means to add a feedback contribution to its electrical output, the electronic filter comprising:
first means for electronic processing of the electrical output of the microphone means in accordance with a series of coefficients to produce a filtered signal; and
adaptive filter means, interconnected with said first means, for electronic processing of the filtered signal to produce an adaptive output to said first means to substantially offset the feedback contribution in the electrical output of the microphone means, said adaptive filter means including means for varying each coefficient in magnitude in the series of coefficients by increasing or decreasing each coefficient as a function of the combined signal input, the increasing or decreasing of each coefficient depending on whether a value corresponding thereto in the series of values is the same as or opposite from the currently-occurring polarity of the combined signal input, the adaptive output thereby substantially offsetting the feedback contribution in the electrical output of said microphone means.

76. An electronic filter as set forth in claim 69 wherein said adaptive means comprises:
first combining means for combining the filtered signal with the second distinct signal for the transducer in a proportion wherein the magnitude of the second distinct signal is generally less than the magnitude of the filtered signal at loudness of normal speech; and
second combining means for combining the filtered signal with the second distinct signal to produce a control signal for affecting the processing by said means for electronic processing wherein the magnitude of the second distinct signal is generally greater than the magnitude of the filtered signal at loudness of normal speech.

77. A hearing aid comprising:
microphone means for generating an electrical output from sounds external to a user of the hearing aid;
electrically driven receiver means for emitting sound into the ear of the user of the hearing aid, some of the sound emitted by the receiver returning to said microphone means to add a feedback contribution to its electrical output;

first means for electronic processing of the electrical output of the microphone means to produce a filtered signal and for combining the filtered signal with a second distinct signal for the receiver of the hearing aid; and digital adaptive filter means, interconnected with said first means, for electronic processing of the filtered signal and second distinct signal while the first means is producing the filtered signal to produce an adaptive output to said first means to continuously simultaneously offset the feedback contribution in the electrical output of the microphone means in the hearing aid.

78. A hearing aid as set forth in claim 77 wherein said digital adaptive filter means includes means for adapting only in response to polarities of signals supplied to and from said first means.

* * * * *